United States Patent
Chen et al.

(10) Patent No.: US 11,908,751 B2
(45) Date of Patent: Feb. 20, 2024

(54) TRANSISTOR ISOLATION REGIONS AND METHODS OF FORMING THE SAME

(71) Applicant: Taiwan Semiconductor Manufacturing Co., Ltd., Hsinchu (TW)

(72) Inventors: Szu-Ying Chen, Hsinchu (TW); Sen-Hong Syue, Zhubei (TW); Huicheng Chang, Tainan (TW); Yee-Chia Yeo, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 71 days.

(21) Appl. No.: 17/385,561

(22) Filed: Jul. 26, 2021

(65) Prior Publication Data
US 2022/0359311 A1  Nov. 10, 2022

Related U.S. Application Data

(60) Provisional application No. 63/184,575, filed on May 5, 2021.

(51) Int. Cl.
*H01L 21/8238* (2006.01)
*H01L 27/092* (2006.01)
*H01L 21/762* (2006.01)
*H01L 21/02* (2006.01)

(52) U.S. Cl.
CPC .. *H01L 21/823878* (2013.01); *H01L 21/0228* (2013.01); *H01L 21/76224* (2013.01); *H01L 21/823821* (2013.01); *H01L 27/0924* (2013.01)

(58) Field of Classification Search
CPC ......... H01L 21/823878; H01L 21/0228; H01L 21/76224; H01L 21/823821; H01L 27/0924; H01L 21/02126; H01L 21/02164; H01L 21/0217; H01L 21/02211; H01L 21/02219; H01L 21/02274; H01L 21/823431; H01L 21/823481; H01L 27/0886; H01L 29/66795
See application file for complete search history.

(56) References Cited

U.S. PATENT DOCUMENTS

| | | |
|---|---|---|
| 8,895,446 B2 | 11/2014 | Peng et al. |
| 9,406,547 B2 | 8/2016 | Jhaveri et al. |
| 9,564,353 B2 | 2/2017 | Huang et al. |
| 10,930,767 B2 | 2/2021 | Ching et al. |
| 11,393,711 B2 | 7/2022 | Kao et al. |

(Continued)

FOREIGN PATENT DOCUMENTS

| | | |
|---|---|---|
| TW | 202013523 A | 4/2020 |
| TW | 202020991 A | 6/2020 |

*Primary Examiner* — Fernando L Toledo
*Assistant Examiner* — Adam S Bowen
(74) *Attorney, Agent, or Firm* — Slater Matsil, LLP

(57) ABSTRACT

In an embodiment, a method includes: etching a trench in a substrate; depositing a liner material in the trench with an atomic layer deposition process; depositing a flowable material on the liner material and in the trench with a contouring flowable chemical vapor deposition process; converting the liner material and the flowable material to a solid insulation material, a portion of the trench remaining unfilled by the solid insulation material; and forming a hybrid fin in the portion of the trench unfilled by the solid insulation material.

20 Claims, 29 Drawing Sheets

(56) References Cited

U.S. PATENT DOCUMENTS

| | | | |
|---|---|---|---|
| 2019/0027556 A1* | 1/2019 | Shu | H01L 21/823431 |
| 2019/0103304 A1* | 4/2019 | Lin | H01L 29/6681 |
| 2019/0157156 A1* | 5/2019 | Chen | H01L 21/76224 |
| 2019/0385898 A1* | 12/2019 | Peng | H01L 21/76224 |
| 2020/0058649 A1* | 2/2020 | Ching | H01L 27/0886 |
| 2020/0066718 A1* | 2/2020 | Li | H01L 29/6681 |
| 2020/0135580 A1* | 4/2020 | Hsieh | H01L 21/31053 |

* cited by examiner

TRANSISTOR ISOLATION REGIONS AND METHODS OF FORMING THE SAME

PRIORITY CLAIM AND CROSS-REFERENCE

This application claims the benefit of U.S. Provisional Application No. 63/184,575, filed on May 5, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
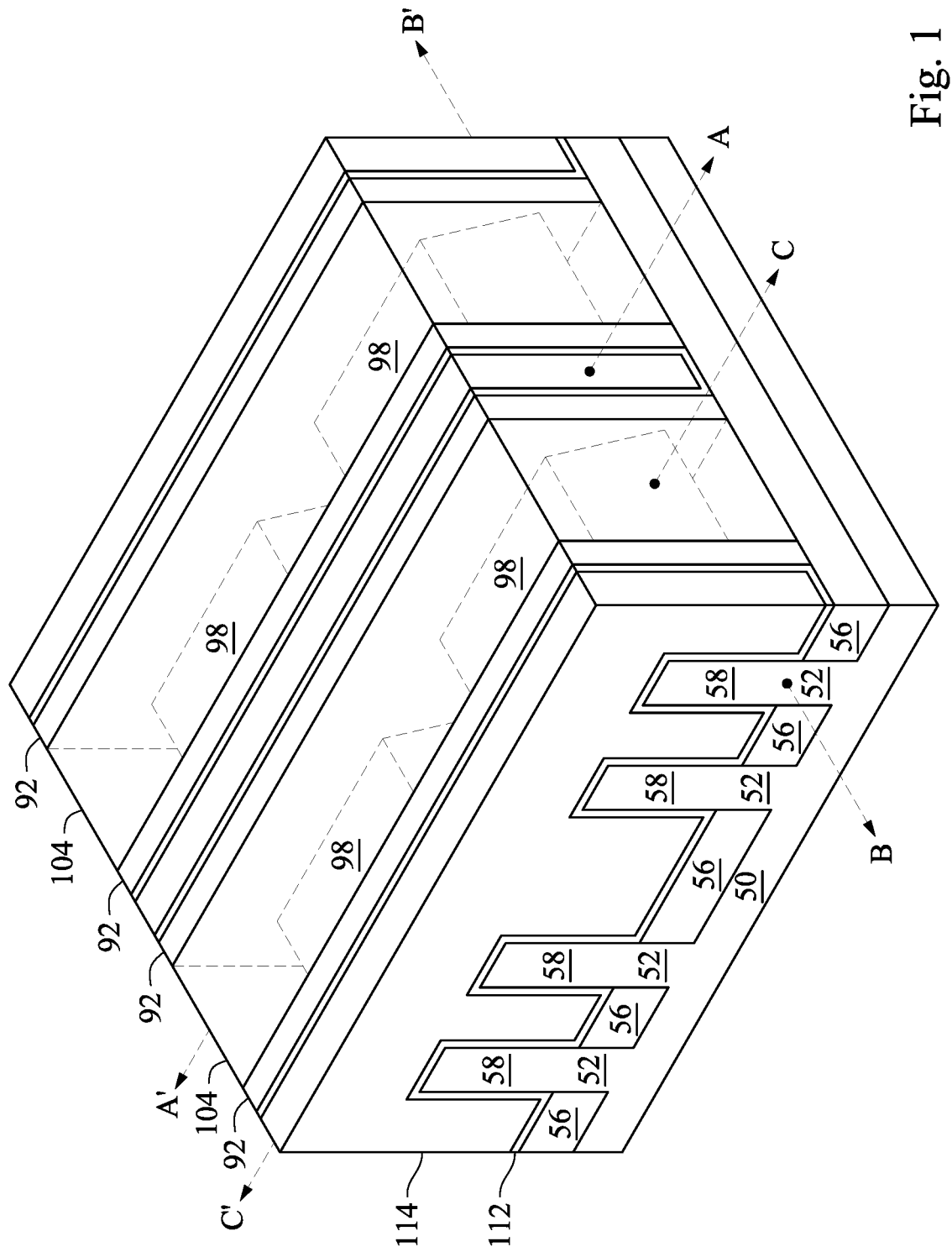
FIG. 1 illustrates an example of Fin Field-Effect Transistors (FinFETs), in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, a fill layer for shallow trench isolation (STI) regions is deposited between adjacent fin structures by a contouring FCVD process. The contouring FCVD process forms the fill layer conformally, leaving partially unfilled trenches between the fin structures, in which hybrid fins may be formed. The contouring FCVD process has good gap-filling properties, allowing the fill layer to be conformally deposited while avoiding the formation of voids or seams in the STI regions. Kink defects in the devices may thus be reduced, increasing the manufacturing yield and performance of the resulting FinFETs.

FIG. 1 illustrates an example of Fin Field-Effect Transistors (FinFETs), in accordance with some embodiments. FIG. 1 is a three-dimensional view, where some features of the FinFETs are omitted for illustration clarity. The FinFETs include semiconductor fins 54 extending from a substrate 50 (e.g., a semiconductor substrate), with the semiconductor fins 54 acting as channel regions 58 for the FinFETs. Isolation regions 70, such as shallow trench isolation (STI) regions, are disposed between adjacent semiconductor fins 54, which may protrude above and from between adjacent isolation regions 70. Although the isolation regions 70 are described/illustrated as being separate from the substrate 50, as used herein, the term "substrate" may refer to the semiconductor substrate alone or a combination of the semiconductor substrate and the isolation regions. Additionally, although the bottom portions of the semiconductor fins 54 are illustrated as being single, continuous materials with the substrate 50, the bottom portions of the semiconductor fins 54 and/or the substrate 50 may include a single material or a plurality of materials. In this context, the semiconductor fins 54 refer to the portion extending from between the adjacent isolation regions 70.

Gate dielectrics 112 are along sidewalls and over top surfaces of the semiconductor fins 54. Gate electrodes 114 are over the gate dielectrics 112. Epitaxial source/drain regions 98 are disposed in opposite sides of the semiconductor fins 54 with respect to the gate dielectrics 112 and the gate electrodes 114. Gate spacers 92 are between the source/drain regions 98 and the gate electrodes 114. An inter-layer dielectric (ILD) 104 is over the epitaxial source/drain regions 98. Source/drain contacts (subsequently described) to the epitaxial source/drain regions 98 are formed through the ILD 104. The epitaxial source/drain regions 98 may be shared between various semiconductor fins 54. For example, adjacent epitaxial source/drain regions 98 may be electrically connected, such as through coalescing the epitaxial source/drain regions 98 by epitaxial growth, or through coupling the epitaxial source/drain regions 98 with a same source/drain contact.

FIG. 1 further illustrates reference cross-sections that are used in later figures. Cross-section A-A' is along a longitudinal axis of a gate electrode 114. Cross-section B-B' is perpendicular to cross-section A-A' and is along a longitudinal axis of a semiconductor fin 54 and in a direction of, for example, a current flow between the epitaxial source/drain regions 98 of a FinFET. Cross-section C-C' is parallel to cross-section A-A' and extends through epitaxial source/ drain regions 98 of the FinFETs. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2-18C are views of intermediate stages in the manufacturing of FinFETs, in accordance with some embodiments. FIGS. 2, 3, 4, 5, 6, 7, 8, and 9 are cross-sectional views illustrated along a similar cross-section as either of reference cross-sections A-A' and C-C' in FIG. 1. FIGS. 10A, 11A, 12A, 13A, 14A, 15A, 16A, 17A, and 18A are cross-sectional views illustrated along a similar cross-section as reference cross-section A-A' in FIG. 1. FIGS. 10B, 11B, 12B, 13B, 14B, 15B, 16B, 17B, and 18B are cross-sectional views illustrated along a similar cross-section as reference cross-section B-B' in FIG. 1. FIGS. 10C, 11C, 12C, 13C, 14C, 15C, 16C, 17C, and 18C are cross-sectional views illustrated along a similar cross-section as reference cross-section C-C' in FIG. 1.

Figure 2:
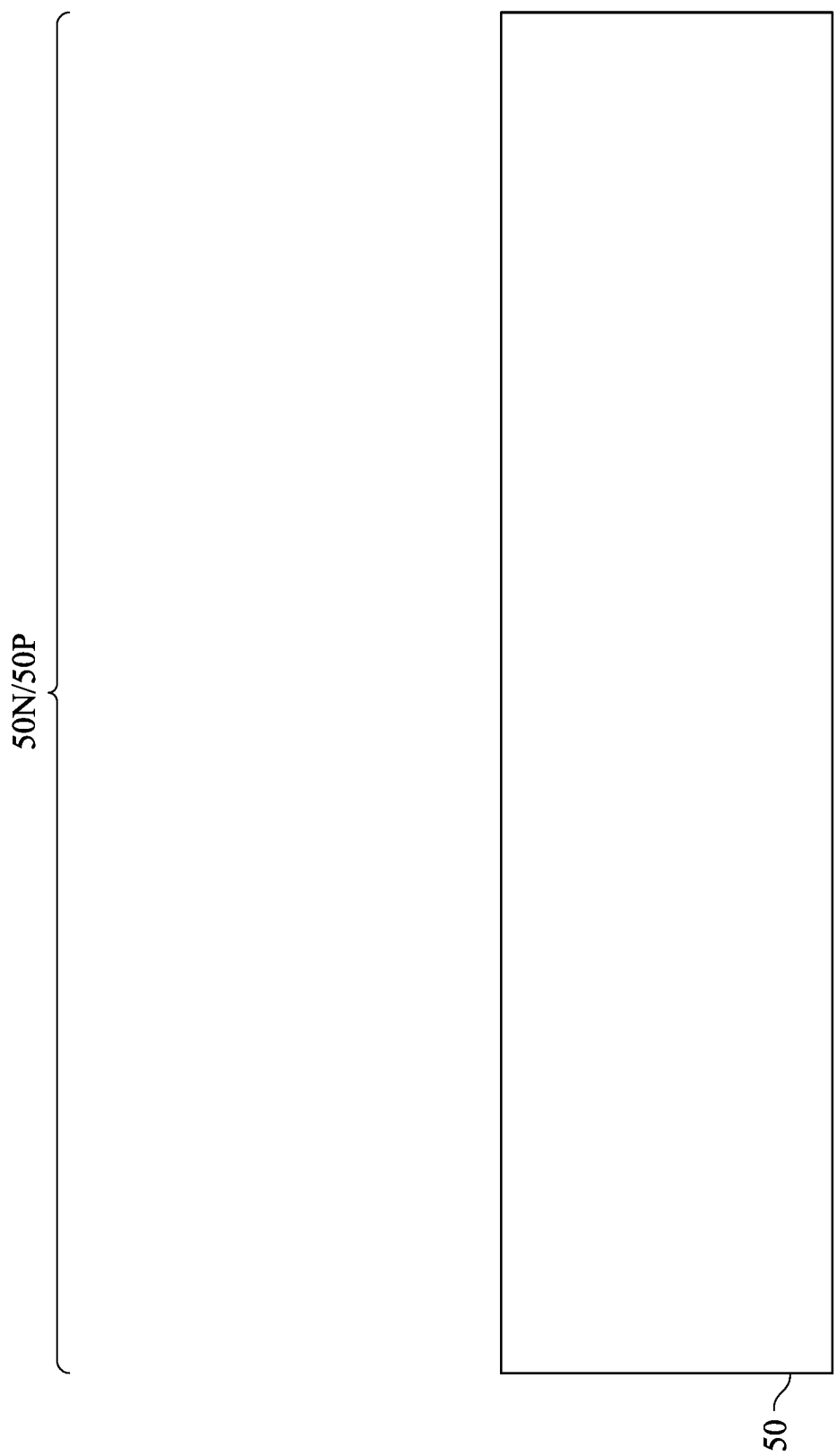
FIGS. 2-18C are views of intermediate stages in the manufacturing of FinFETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type impurity) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; combinations thereof; or the like.

The substrate 50 has an n-type region 50N and a p-type region 50P. The n-type region 50N can be for forming n-type devices, such as NMOS transistors, e.g., n-type FinFETs, and the p-type region 50P can be for forming p-type devices, such as PMOS transistors, e.g., p-type FinFETs. The n-type region 50N may be physically separated (not separately illustrated) from the p-type region 50P, and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

Figure 3:
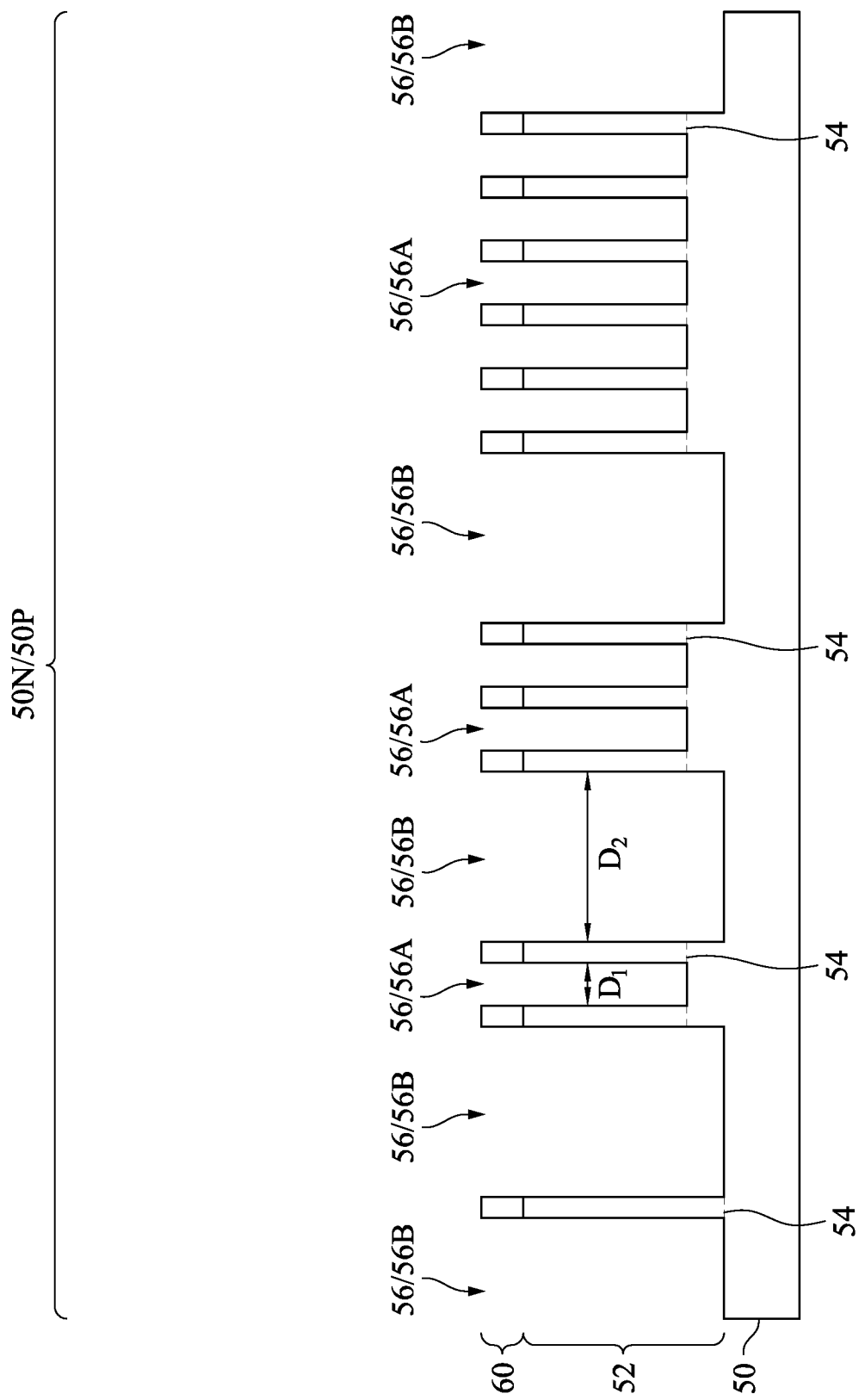

In FIG. 3, fin structures 52 are formed in the substrate 50. The fin structures 52 each include one or more semiconductor fins 54, which are semiconductor strips. The fin structures 52 may be formed in the substrate 50 by etching trenches 56 in the substrate 50. The etching may be any acceptable etching process, such as a reactive ion etch (RIE), neutral beam etch (NBE), the like, or a combination thereof. The etching process may be anisotropic.

The fin structures 52 may be patterned by any suitable method. For example, the fin structures 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used as masks 60 to pattern the fin structures 52. In some embodiments, the masks 60 (or other layer) may remain on the fin structures 52.

Fin structures 52 having one semiconductor fin 54, two semiconductor fins 54, three semiconductor fins 54, and six semiconductor fins 54 are illustrated. However, the fin structures 52 may each have any desired quantity of the semiconductor fins 54. In some embodiments, fin structures 52 with different quantities of semiconductor fins 54 are grouped in different regions. For example, fin structures 52 in a first region of a die (e.g., a core logic region) may have a first quantity of semiconductor fins 54, and fin structures 52 in a second region of the die (e.g., an input/output region) may have a second quantity of semiconductor fins 54, with the second quantity being different from the first quantity.

The trenches 56 have different widths. Specifically, a first subset of the trenches 56A have a lesser width than a second subset of the trenches 56B. The trenches 56A separate the semiconductor fins 54 of respective fin structures 52, and the trenches 56B separate the fin structures 52 from each other. The semiconductor fins 54 of respective fin structures 52 are spaced apart by a lesser distance than the fin structures 52 are spaced apart from each other. In some embodiments, the semiconductor fins 54 of respective fin structures 52 are spaced apart by a distance $D_1$ in the range of 5 nm to 12 nm, the fin structures 52 are spaced apart from each other by a distance $D_2$ in the range of 15 nm to 40 nm, and the distance $D_2$ is greater than the distance $D_1$. The trenches 56 may be formed with different widths by patterning the masks 60 with a pattern having features spaced apart by different distances that correspond to the different widths of the trenches 56. The widths of the trenches 56 defines the width of the semiconductor fins 54 (also referred to as the critical dimension of the semiconductor fins 54). In some embodiments, the semiconductor fins 54 have a critical dimension in the range of 20 nm to 180 nm.

The trenches 56 have different depths. Specifically, the trenches 56A have a lesser depth than the trenches 56B. In some embodiments, the trenches 56A have a first depth in the range of 80 nm to 130 nm, the trenches 56B have a second depth in the range of 100 nm to 120 nm, and the second depth is greater than the first depth. The trenches 56 may be formed with different depths as a result of pattern loading effects during etching of the trenches 56, with the pattern loading effects caused by the pattern of the masks 60 having features spaced apart by different distances. The depths of the trenches 56 defines the height of the semiconductor fins 54. In some embodiments, the semiconductor fins 54 have a height in the range of 10 nm to 100 nm.

As will be subsequently described in greater detail, an insulation material 64 (see FIG. 5) for isolation regions will be formed over the substrate 50 and between adjacent semiconductor fins 54. The insulation material 64 is formed so that it does not fill all of the trenches 56. Specifically, because the spacing distance $D_2$ is greater than the spacing distance $D_1$ (see FIG. 3), the insulation material 64 fills the trenches 56A without filling the trenches 56B. For example, the dispensed volume of the insulation material 64 may be sufficient to completely fill (or overfill) the trenches 56A, but may be insufficient to completely fill the trenches 56B. The insulation material 64 conformally lines the trenches 56B, including the surfaces of the substrate 50 and the sidewalls of the semiconductor fins 54 that define the trenches 56B. The insulation material 64 is formed by forming a film stack 62 (see FIG. 4) that includes one or more layer(s), and then subsequently curing the layer(s) of the film stack 62 to form the insulation material 64. The layer(s) of the film stack 62 are deposited by conformal deposition process(es), so that the trenches 56B are conformally lined by the film stack 62. The main layer (e.g., fill layer) of the film stack 62 is formed of a flowable material deposited by a contouring FCVD process, which has better gap-filling properties than other types of conformal deposition processes such as ALD, allowing the formation of voids or seams in the insulation material 64 to be reduced.

Figure 4:
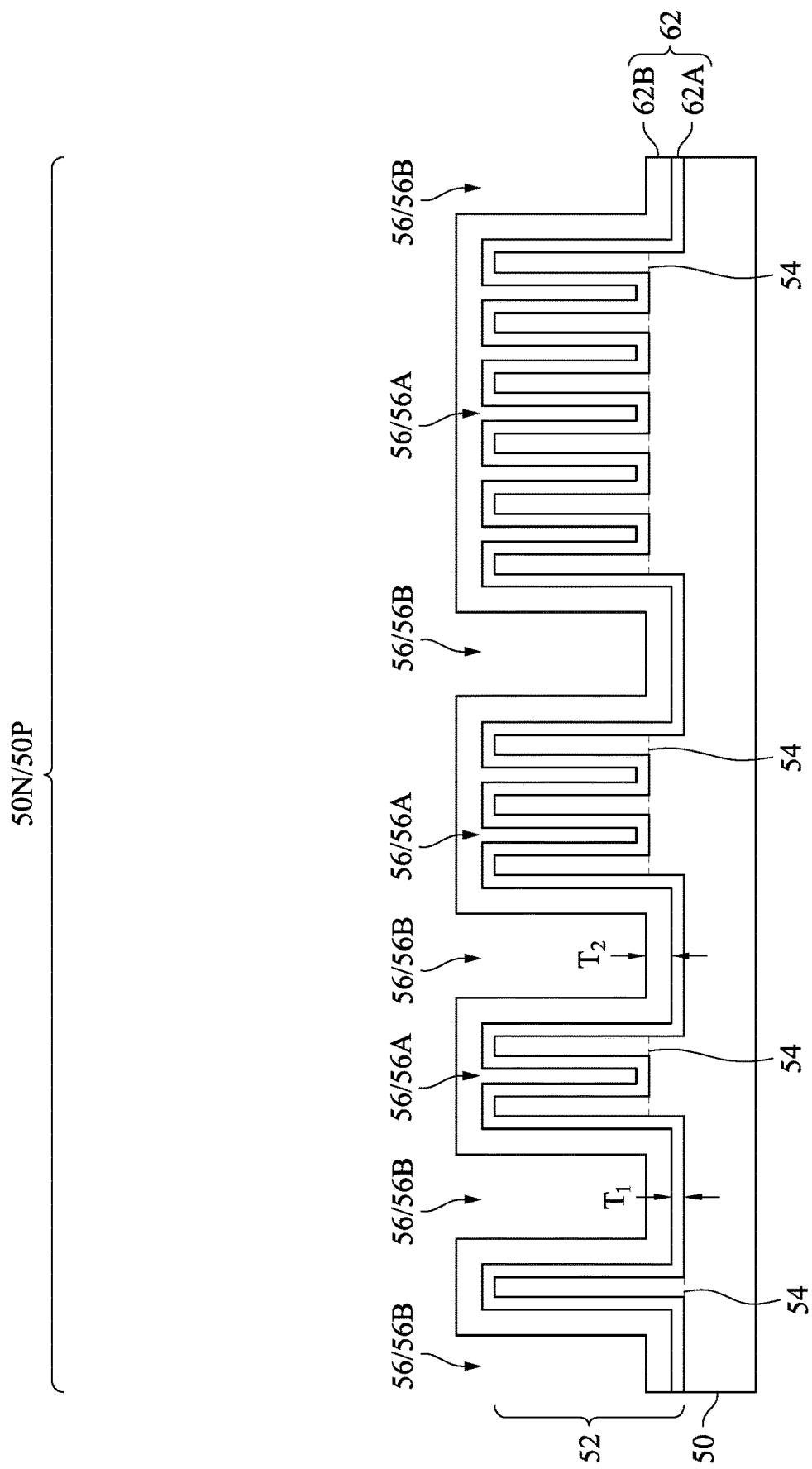

In FIG. 4, a film stack 62 is formed in the trenches 56 and over the semiconductor fins 54. In the illustrated embodiment, the film stack 62 includes a liner layer 62A (which is optional) and a fill layer 62B. The liner layer 62A (if present) is deposited on surfaces of the substrate 5o and the semiconductor fins 54. The fill layer 62B is deposited on the liner layer 62A (if present) or on the surfaces of the substrate 50 and the semiconductor fins 54 (if the liner layer 62A is omitted).

The liner layer 62A (if present) is formed of a liner material such as silicon nitride, silicon oxynitride, silicon oxycarbide, silicon carbonitride, silicon oxycarbonitride, or the like, which may be deposited by atomic layer deposition (ALD), flowable chemical vapor deposition (FCVD), or the like. The liner layer 62A is deposited until it is thick enough to line the trenches 56A and the trenches 56B, without completely filling those trenches. In some embodiments, the liner layer 62A is deposited to a thickness $T_1$ in the range of 0 nm to 8 nm.

The fill layer 62B is formed of a fill material such as amorphous silicon, silicon oxide, silicon oxynitride, silicon oxycarbide, silicon carbonitride, silicon oxycarbonitride, or the like, which may be deposited by flowable chemical vapor deposition (FCVD). The fill layer 62B is deposited until it is thick enough to fill (or overfill) the trenches 56A and to line the trenches 56B without completely filling the trenches 56B. The thickness of the fill layer 62B in the trenches 56B (e.g., along the bottoms of the trenches 56B) is less than or equal to the width of the trenches 56B. In some embodiments, the fill layer 62B is deposited to a thickness $T_2$ in the range of 10 nm to 15 nm. The thickness of the fill layer 62B is, in combination with the liner layer 62A (if present), sufficient to completely fill (or overfill) the trenches 56A, but is insufficient to completely fill the trenches 56B. In some embodiments, the ratio of the thickness $T_2$ to the distance $D_2$ (see FIG. 3) is in the range of 20% to 100%.

In some embodiments, the liner layer 62A and the fill layer 62B are formed of different materials. For example, the liner layer 62A may be formed of a material that is suitable for protecting the semiconductor fins 54 from oxidation, such as silicon nitride, and the fill layer 62B may be formed of a material that is capable of being converted to an oxide, such as silicon oxynitride. In other embodiments, the liner layer 62A and the fill layer 62B are formed of the same material, such as silicon oxynitride.

In some embodiments, the liner layer 62A and the fill layer 62B are formed by different types of deposition processes. For example, the liner layer 62A may be formed by a first type of conformal deposition process such as ALD, and the fill layer 62B may be formed by a second type of conformal deposition process such as FCVD. In other embodiments, the liner layer 62A and the fill layer 62B are formed by the same type of deposition process, such as FCVD.

The liner layer 62A may be formed by an ALD process. The ALD process is performed by placing the substrate 50 in a deposition chamber and cyclically dispensing multiple source precursors into the deposition chamber, thus exposing the surfaces of the substrate 50 to the source precursors. The source precursors include a first precursor and a second precursor, which are any acceptable precursors that can react to deposit the liner material of the liner layer 62A in the solid phase. In some embodiments where the liner material is silicon nitride, the first precursor is a silicon-containing precursor and the second precursor is a nitrogen-containing precursor. Acceptable silicon-containing precursors for depositing silicon nitride include binary silicon-hydrogen compound silanes such as silane ($SiH_4$), disilane ($Si_2H_6$), dichlorosilane ($H_2SiCl_2$), and the like. Acceptable nitrogen-containing precursors for depositing silicon nitride include ammonia ($NH_3$) and the like. Other acceptable precursors may be used. A first pulse of an ALD cycle is performed by dispensing the first precursor (e.g., a silicon-containing precursor such as silane) into the deposition chamber. The first precursor is kept in the deposition chamber until the first precursor has reacted with the available reactive sites on the surfaces of the substrate 50. The first precursor is then purged from the deposition chamber, such as by any acceptable vacuuming process and/or by flowing an inert gas into the deposition chamber. A second pulse of the ALD cycle is performed by dispensing the second precursor (e.g., a nitrogen-containing precursor such as ammonia) into the deposition chamber. The second precursor is kept in the deposition chamber until the second precursor has reacted with the available reactive sites on the surfaces of the substrate 50. The second precursor is then purged from the deposition chamber, such as by any acceptable vacuuming process and/or by flowing an inert gas into the deposition chamber. Each ALD cycle results in the deposition of an atomic layer (sometimes called a monolayer) of the liner material of the liner layer 62A. The ALD cycle is repeated a number of times, until the liner material of the liner layer 62A is deposited to a desired thickness (previously described).

The ALD process for depositing the liner material of the liner layer 62A has a high degree of uniformity. Specifically, the deposition rate of the ALD process along vertical surfaces (e.g., the sidewalls of the semiconductor fins 54) is substantially equal to the deposition rate of the ALD process along horizontal surfaces (e.g., the top surfaces of the semiconductor fins 54 and the substrate 50). As such, the horizontal portions and the vertical portions of the liner layer 62A have a substantially uniform thickness $T_1$. For example, the difference between the thickness $T_1$ of the horizontal portions of the liner layer 62A and the thickness $T_1$ of the vertical portions of the liner layer 62A can be less than 15 nm.

The fill layer 62B is formed by a contouring FCVD process. The contouring FCVD process deposits the fill material of the fill layer 62B as a flowable material, which will subsequently be cured to convert it to a solid material. In some embodiments, the flowable material is a flowable insulation material such as silicon oxynitride, silicon oxycarbide, silicon carbonitride, silicon oxycarbonitride, silicon oxide, amorphous silicon, or the like in the liquid phase, and the solid material is a solid insulation material such as silicon oxide in the solid phase. The flowable material deposited by the contouring FCVD process has a high viscosity. Depositing the flowable material with a high viscosity allows the fill layer 62B to fill the trenches 56A while conformally lining the trenches 56B. Depositing the flowable material without a high viscosity may cause the formation of voids or seams in the trenches 56A. Depositing the flowable material without a high viscosity may cause the fill layer 62B to fill the lower portions of the trenches 56B instead of conformally lining the trenches 56B.

The contouring FCVD process is performed by placing the substrate 50 in a deposition chamber and simultaneously dispensing multiple source precursors into the deposition chamber, thus exposing the surfaces of the liner layer 62A (if present) or the substrate 50 to the source precursors. The deposition chamber used in the contouring FCVD process for depositing the fill layer 62B may be different from the deposition chamber used in the ALD process for depositing the liner layer 62A. In some embodiments where the flowable material is silicon oxynitride, the source precursors include a silicon-containing precursor, an oxygen-containing precursor, and a nitrogen-containing precursor. The silicon-containing precursor may be trisilylamine (TSA) or the like, the oxygen-containing precursor may be oxygen gas ($O_2$) or the like, and the nitrogen-containing precursor may be ammonia ($NH_3$) or the like. In some embodiments, the silicon-containing precursor is dispensed at a flow rate in the range of 900 sccm to 1410 sccm, the oxygen-containing precursor is dispensed at a flow rate in the range of 10 sccm to 100 sccm, and the nitrogen-containing precursor is dispensed at a flow rate in the range of 20 sccm to 100 sccm, where a ratio of the silicon-containing precursor flow rate to the nitrogen-containing precursor flow rate is at least 10. The contouring FCVD process may be performed at a low pressure. In some embodiments, the deposition chamber is maintained at a pressure of less than 600 Torr. A plasma may be generated in the deposition chamber while the source precursors are dispensed into the deposition chamber, thereby allowing the contouring FCVD process to be performed at a low temperature while achieving a desirable deposition rate. In some embodiments, the deposition chamber is maintained at a temperature in the range of 10° C. to 135° C., allowing the deposition rate to be in the range of 5 Å/s to 15 Å/s. In some embodiments, the deposition chamber is maintained at a temperature of less than 100° C. In some embodiments, the deposition chamber is maintained at a temperature of less than room temperature (e.g., less than about 20° C.). Performing the contouring FCVD process with processing conditions (e.g., precursor flow rates, pressure, temperature, etc.) in these ranges allows the flowable material to be deposited with a high viscosity (previously described). Performing the contouring FCVD process with processing conditions outside these ranges may not allow the flowable material to be deposited with a high viscosity. The contouring FCVD process is performed until the flowable material is deposited to a desired thickness (previously described).

The contouring FCVD process for depositing the fill layer 62B has a high degree of uniformity. Specifically, the deposition rate of the contouring FCVD process along vertical surfaces (e.g., the sidewalls of the liner layer 62A (if present) or the semiconductor fins 54) is substantially equal to the deposition rate of the contouring FCVD process along horizontal surfaces (e.g., the top surfaces of the liner layer 62A (if present) or the semiconductor fins 54 and the substrate 50). As such, the horizontal portions and the vertical portions of the fill layer 62B have a substantially uniform thickness $T_2$. For example, the difference between the thickness $T_2$ of the horizontal portions of the fill layer 62B and the thickness $T_2$ of the vertical portions of the fill layer 62B can be less than 15 nm.

The process for depositing the fill layer 62B also has good gap-filling properties. In some embodiments, the contouring FCVD process for depositing the fill layer 62B has better gap-filling properties than ALD processes, such as the ALD process for depositing the liner layer 62A. As noted above, the flowable material completely fills (or overfills) the trenches 56A. The flowable material is deposited in the trenches 56A until it is thick enough to merge together. Because the flowable material has a high viscosity, the formation of voids or seams is avoided when the portions of the flowable material in the trenches 56A merge together. Kink defects in the devices may thus be reduced, increasing the manufacturing yield and performance of the resulting FinFETs.

Some variations are contemplated. In some embodiments, the liner layer 62A and the fill layer 62B are formed of different materials (e.g., silicon nitride and silicon oxynitride, respectively) but are formed by the same type of deposition process (e.g., contouring FCVD processes). In some embodiments, the liner layer 62A and the fill layer 62B are formed of the same material (e.g., silicon oxynitride) but are formed by different types of deposition processes (e.g., ALD and contouring FCVD processes, respectively).

Figure 5:
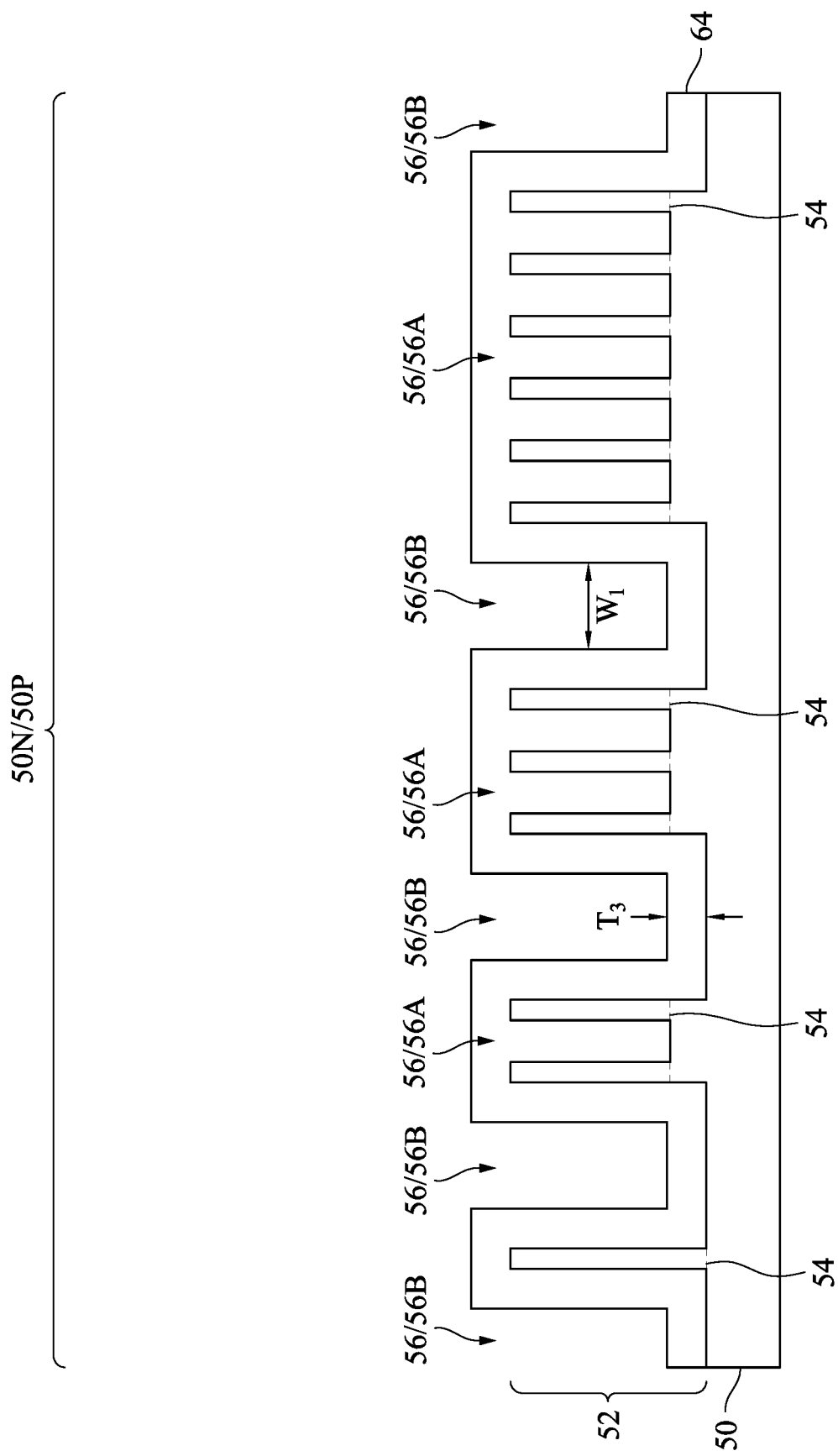

In FIG. 5, the film stack 62 is annealed to convert each of the layer(s) of the film stack 62 to an insulation material 64 for isolation regions. The anneal process may be performed in an oxygen-containing environment, such as by annealing the film stack 62 while exposing it to an oxygen-containing process gas. The oxygen-containing process gas may include oxygen ($O_2$), ozone ($O_3$), or the like. In some embodiments, the anneal process is a steam anneal, in which the oxygen-containing process gas is steam ($H_2O$) produced by in-situ steam generation (ISSG). Other acceptable oxygen-containing process gases generated by any acceptable technique may also be used. The anneal process drives oxygen from the oxygen-containing process gas into the film stack 62 and also drives undesirable impurities (e.g., nitrogen/carbon) out of the film stack 62, thus curing the film stack 62 and solidifying the flowable material to form a solid material. The resulting insulation material 64 may be an oxide (e.g., silicon oxide). In some embodiments, the liner layer 62A is silicon nitride and the fill layer 62B is silicon oxynitride before the anneal process, and both layers are converted to silicon oxide after the anneal process. In some embodiments, the film stack 62 is annealed at a temperature in the range of 400° C. to 700° C., and for a duration in the range of 1 hour to 6 hours. Performing the anneal process with processing conditions (e.g., temperature, duration, etc.) in these ranges allows the film stack 62 to be completely converted to the insulation material 64. Performing the anneal process with processing conditions outside these ranges may not allow the film stack 62 to be completely converted to the insulation material 64.

Oxidizing the insulation material 64 increases its volume, and as such, the insulation material 64 is thicker than the film stack 62. In some embodiments, the insulation material 64 has a thickness $T_3$ in the range of 15 nm to 30 nm. Because the layer(s) of the film stack 62 have substantially uniform thicknesses, the portions of the insulation material 64 in the trenches 56B also have a substantially uniform thickness $T_3$. For example, the difference between the thickness $T_3$ of the horizontal portions of the insulation material 64 and the thickness $T_3$ of the vertical portions of the insulation material 64 can be less than 30 nm.

The portions of the trenches 56B that are not filled (or occupied) by the insulation material 64 have a width that is sufficient to accommodate hybrid fins that will be formed between the fin structures 52. In some embodiments, the remaining portions of the trenches 56B have a width Wi in the range of 50 nm to 100 nm.

Figure 6:
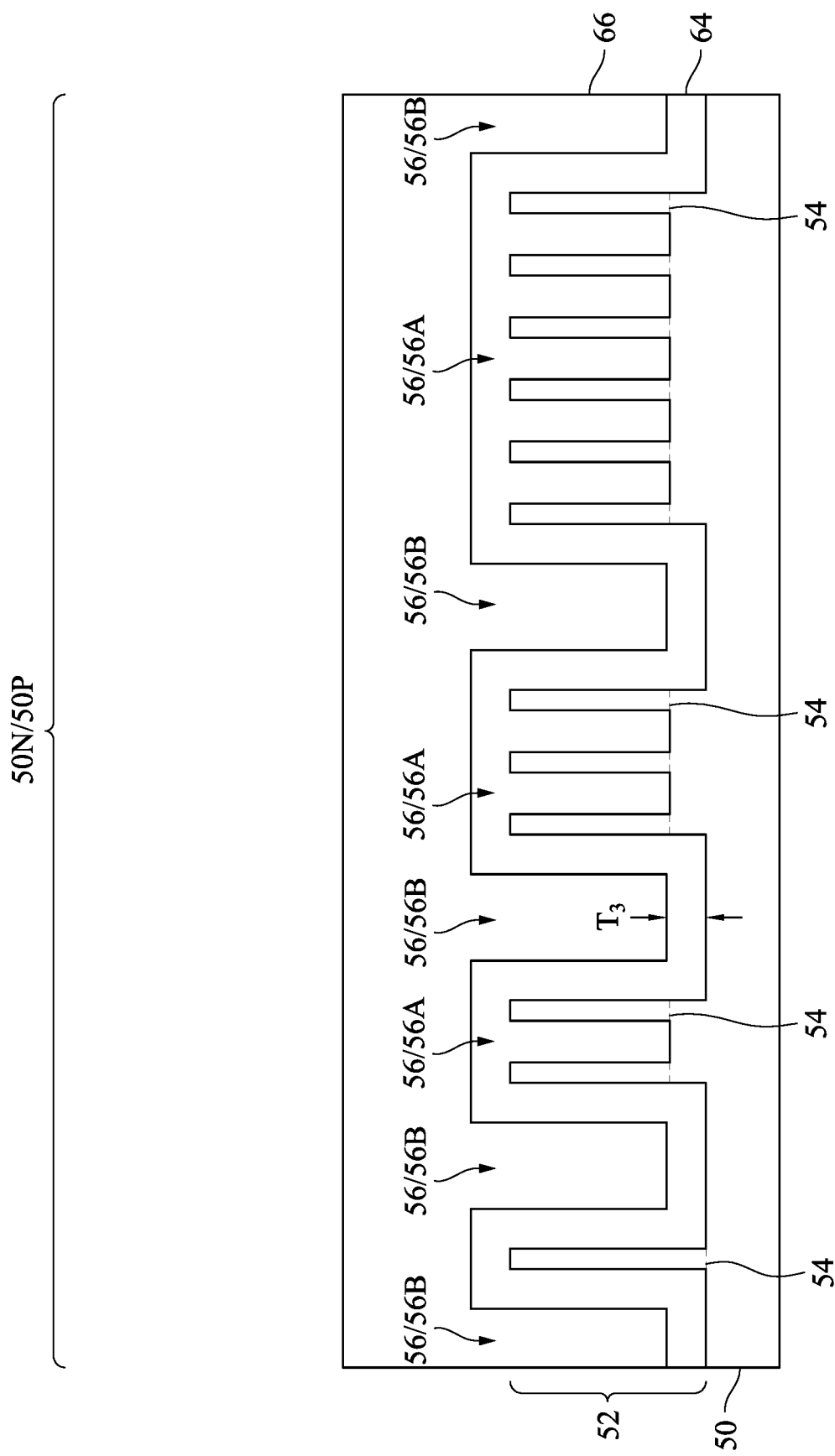

In FIG. 6, one or more dielectric layer(s) 66 are formed on the insulation material 64. The dielectric layer(s) 66 fill (and may overfill) the remaining portions of the trenches 56B that are not filled (or occupied) by the insulation material 64. The dielectric layer(s) 66 may be formed of one or more dielectric material(s). Acceptable dielectric materials include nitrides (e.g., silicon nitride), oxides (e.g., tantalum oxide, aluminum oxide, zirconium oxide, hafnium oxide, etc.), carbides (e.g., silicon carbonitride, silicon oxycarbonitride, etc.), combinations thereof, or the like, which may be deposited by ALD, CVD, or the like. Other insulation materials formed by any acceptable process may be used. Further, the dielectric layer(s) 66 may be formed of a low-k dielectric material (e.g., a dielectric material having a k-value less than about 3.5), a high-k dielectric material (e.g., a dielectric material having a k-value greater than about 7.0), or multi-layers thereof. The dielectric layer(s) 66 are formed of material(s) that have a high etching selectivity from the etching of the insulation material 64.

Figure 7:
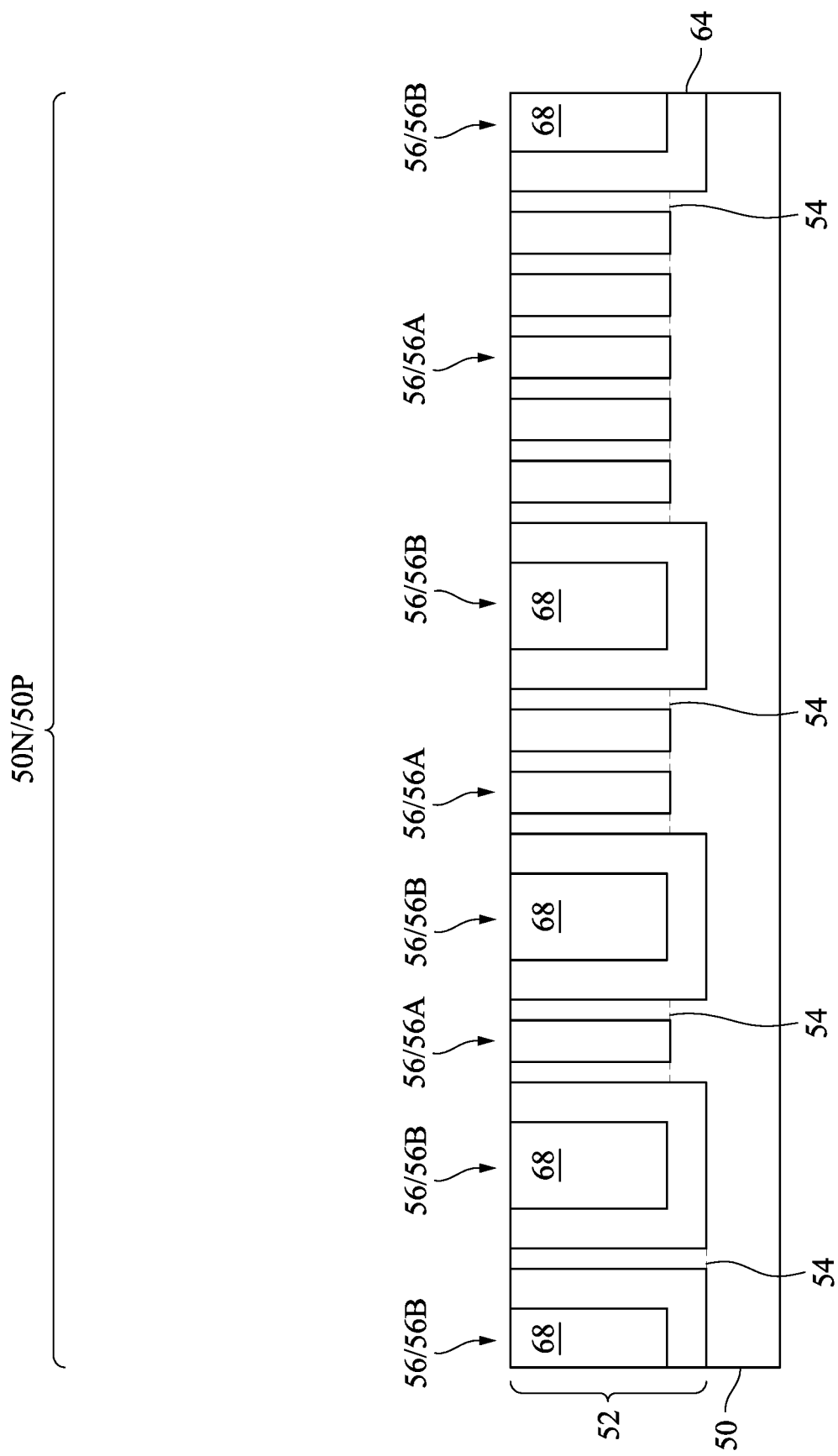

In FIG. 7, a removal process is applied to the dielectric layer(s) 66 and the insulation material 64 to remove excess portions of the dielectric layer(s) 66 and the insulation material 64 over the semiconductor fins 54 (e.g., outside of the trenches 56), thereby forming hybrid fins 68 on the insulation material 64. In some embodiments, a planarization process such as a chemical mechanical polish (CMP), an etch-back process, combinations thereof, or the like may be utilized. The dielectric layer(s) 66, after the removal process, have portions left in the trenches 56B (thus forming the hybrid fins 68). In embodiments in which a mask remains on the semiconductor fins 54, the planarization process may expose the mask or remove the mask. After the planarization process, the top surfaces of the hybrid fins 68, the insulation material 64, and the mask (if present) or the semiconductor fins 54 are coplanar (within process variations), such that they are level with one another. The hybrid fins 68 are disposed between the fin structures 52. The hybrid fins 68 may also be referred to as "dielectric fins."

Figure 8:
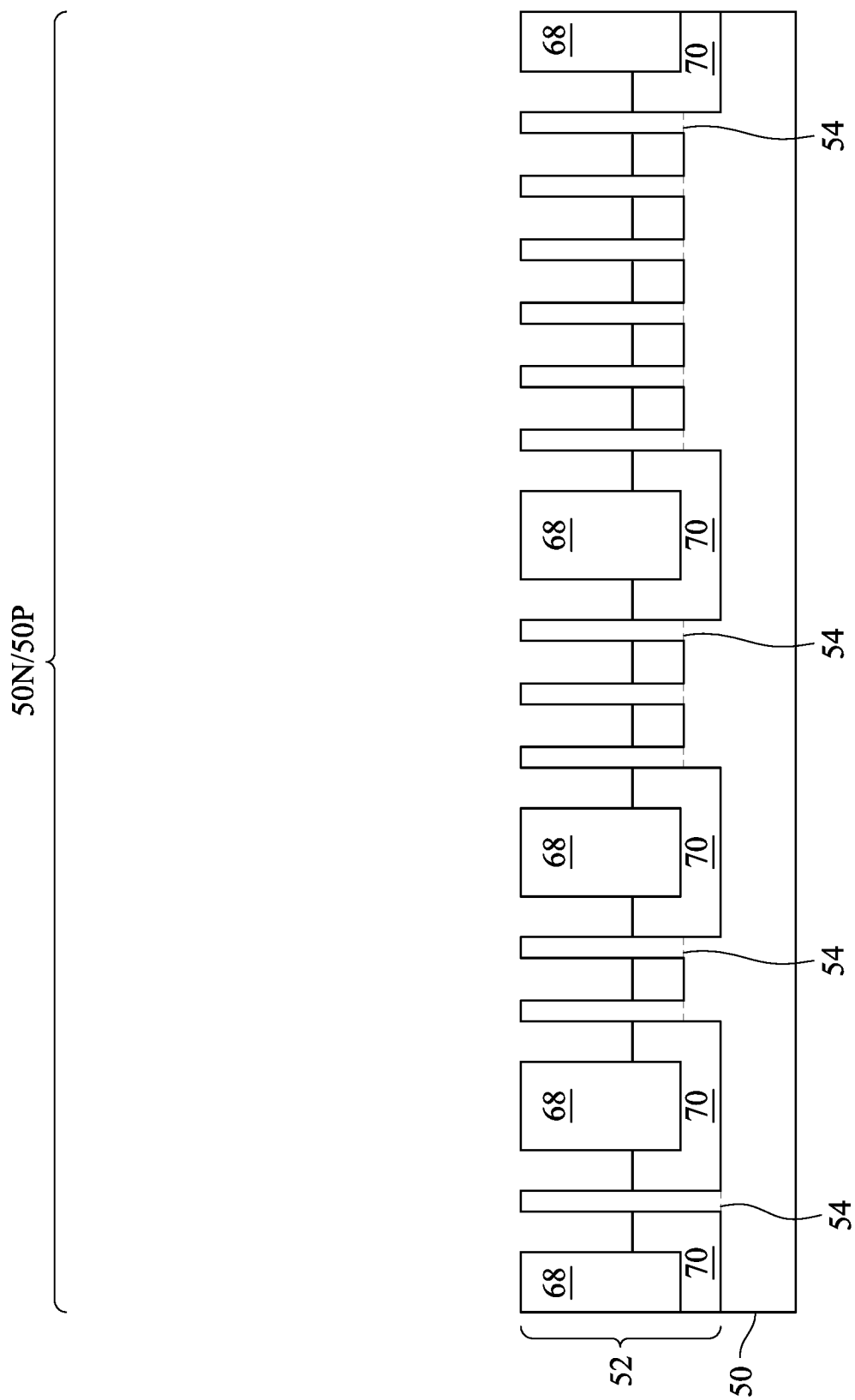

In FIG. 8, the insulation material 64 is recessed to form STI regions 70. The insulation material 64 is recessed such that upper portions of the semiconductor fins 54 and the hybrid fins 68 protrude above and from between neighboring STI regions 70. Further, the top surfaces of the STI regions 70 may have a flat surface as illustrated, a convex surface, a concave surface (such as dishing), or a combination thereof. The top surfaces of the STI regions 70 may be formed flat, convex, and/or concave by an appropriate etch. The insulation material 64 may be recessed using any acceptable etching process, such as one that is selective to the material of the insulation material 64 (e.g., selectively etches the insulation material 64 at a faster rate than the materials of the semiconductor fins 54 and the hybrid fins 68). For example, an oxide removal may be performed using dilute hydrofluoric (dHF) acid.

The process described for FIGS. 2-8 is just one example of how the semiconductor fins 54, the hybrid fins 68, and the STI regions 70 may be formed. In some embodiments, the semiconductor fins 54 and the hybrid fins 68 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in some of the trenches, insulating structures can be deposited in others of the trenches, and the dielectric layer can be recessed (in a similar manner as described for FIG. 7) such that the epitaxial structures protrude from the dielectric layer to form the semiconductor fins 54 and the insulating structures protrude from the dielectric layer to form the hybrid fins 68. In some embodiments where epitaxial structures are epitaxially grown, the epitaxially grown materials may be in situ doped during growth, which may obviate prior and/or subsequent implantations, although in situ and implantation doping may be used together.

Further, it may be advantageous to epitaxially grow a material in n-type region 50N different from the material in p-type region 50P. In various embodiments, upper portions of the semiconductor fins 54 may be formed of silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further, appropriate wells (not separately illustrated) may be formed in the semiconductor fins 54 and/or the substrate 50. The wells may have a conductivity type opposite from a conductivity type of source/drain regions that will be subsequently formed in each of the n-type region 50N and the p-type region 50P. In some embodiments, a p-type well is formed in the n-type region 50N, and an n-type well is formed in the p-type region 50P. In some embodiments, a p-type well or an n-type well is formed in both the n-type region 50N and the p-type region 50P.

In embodiments with different well types, different implant steps for the n-type region 50N and the p-type region 50P may be achieved using a mask (not separately illustrated) such as a photoresist. For example, a photoresist may be formed over the semiconductor fins 54, the hybrid fins 68, and the STI regions 70 in the n-type region 50N. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in the range of $10^{13}$ $cm^{-3}$ to $10^{14}$ $cm^{-3}$. After the implant, the photoresist is removed, such as by any acceptable ashing process.

Following or prior to the implanting of the p-type region 50P, a mask (not separately illustrated) such as a photoresist is formed over the semiconductor fins 54, the hybrid fins 68, and the STI regions 70 in the p-type region 50P. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in the range of $10^{13}$ cm$^{-3}$ to $10^{14}$ cm$^{-3}$. After the implant, the photoresist is removed, such as by any acceptable ashing process.

After the implants of the n-type region 50N and the p-type region 50P, an anneal may be performed to repair implant damage and to activate the p-type and/or n-type impurities that were implanted. In some embodiments where epitaxial structures are epitaxially grown for the semiconductor fins 54, the grown materials may be in situ doped during growth, which may obviate the implantations, although in situ and implantation doping may be used together.

Figure 9:
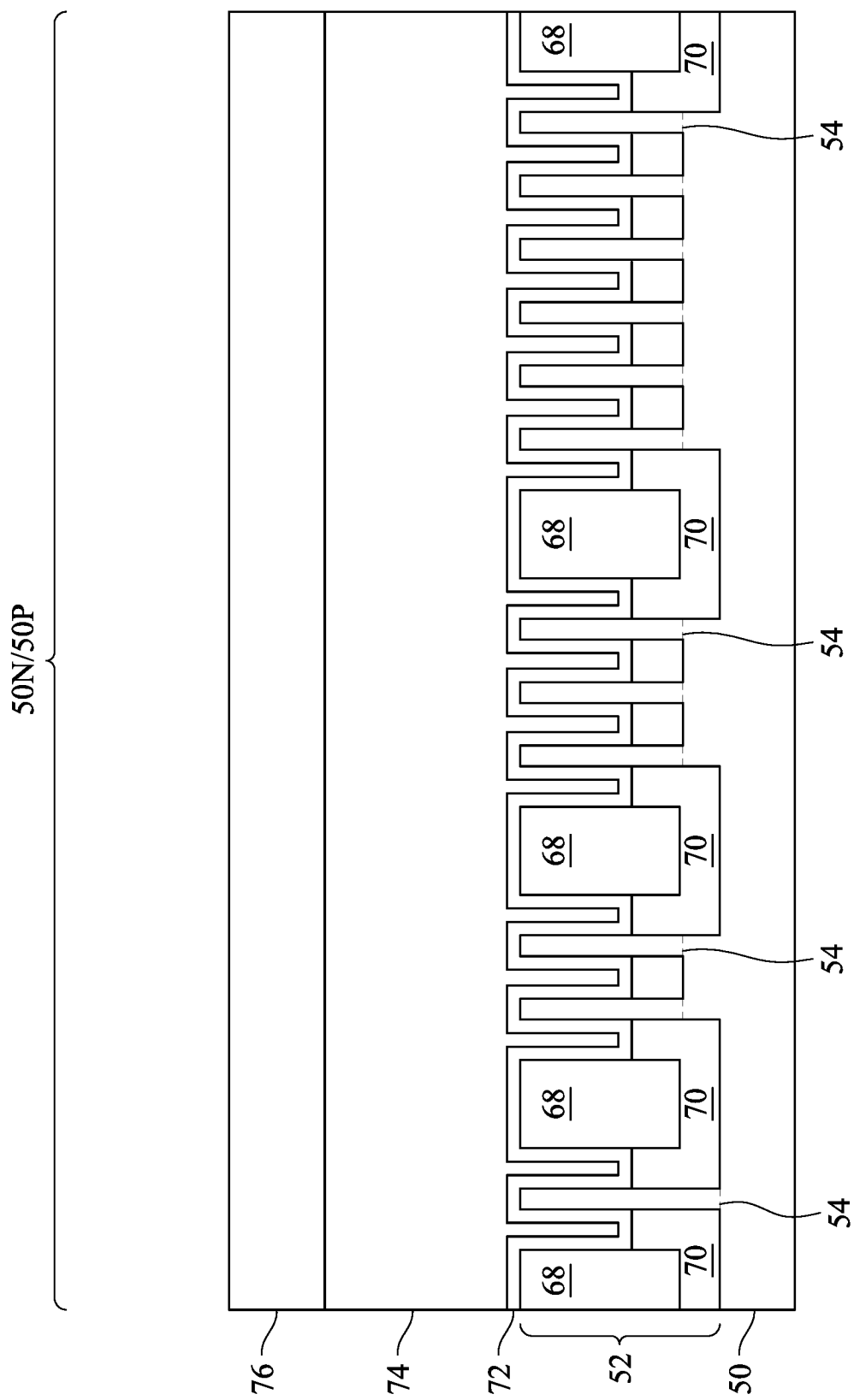

In FIG. 9, a dummy dielectric layer 72 is formed on the semiconductor fins 54 and the hybrid fins 68. The dummy dielectric layer 72 may be formed of a dielectric material such as silicon oxide, silicon nitride, a combination thereof, or the like, which may be deposited or thermally grown according to acceptable techniques such as ALD, in-situ steam growth (ISSG), rapid thermal oxidation (RTO), or the like. A dummy gate layer 74 is formed over the dummy dielectric layer 72, and a mask layer 76 is formed over the dummy gate layer 74. The dummy gate layer 74 may be deposited over the dummy dielectric layer 72 and then planarized, such as by a CMP. The dummy gate layer 74 may be formed of a conductive or non-conductive material, such as amorphous silicon, polycrystalline-silicon (polysilicon), poly-crystalline silicon-germanium (poly-SiGe), a metal, a metallic nitride, a metallic silicide, a metallic oxide, or the like, which may be deposited by physical vapor deposition (PVD), CVD, or the like. The dummy gate layer 74 may be formed of material(s) that have a high etching selectivity from the etching of insulation materials, e.g., the STI regions 70 and/or the dummy dielectric layer 72. The mask layer 76 may be deposited over the dummy gate layer 74. The mask layer 76 may be formed of a dielectric material such as silicon nitride, silicon oxynitride, or the like. In this example, a single dummy gate layer 74 and a single mask layer 76 are formed across the n-type region 50N and the p-type region 50P. In the illustrated embodiment, the dummy dielectric layer 72 covers the semiconductor fins 54, the hybrid fins 68, and the STI regions 70, such that the dummy dielectric layer 72 extends over the STI regions 70 and between the dummy gate layer 74 and the STI regions 70. In another embodiment, the dummy dielectric layer 72 covers only the semiconductor fins 54.

FIGS. 10A-18C illustrate various additional steps in the manufacturing of embodiment devices. FIGS. 10A-18C illustrate features in either of the n-type region 50N and the p-type region 50P. For example, the structures illustrated may be applicable to both the n-type region 50N and the p-type region 50P. Differences (if any) in the structures of the n-type region 50N and the p-type region 50P are explained in the description accompanying each figure. Further FIGS. 10A, 11A, 12A, 13A, 14A, 15A, 16A, 17A, and 18A illustrate a fin structure 52 having two semiconductor fins 54. As noted above, the fin structures 52 have any desired quantity of the semiconductor fins 54.

Figure 10A:
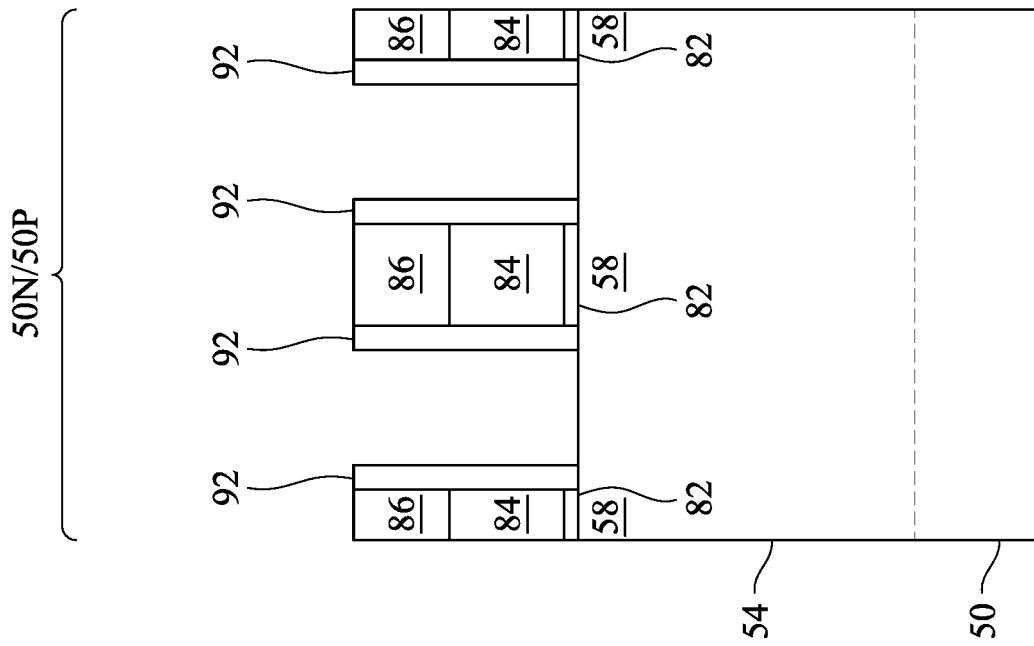
Figure 10B:
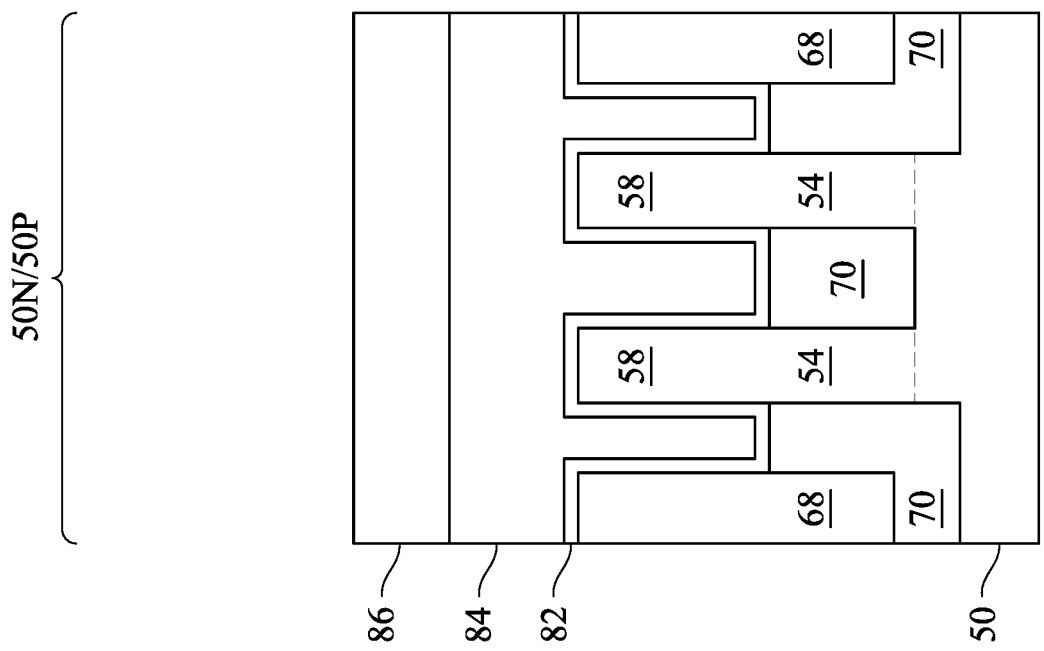
Figure 10C:
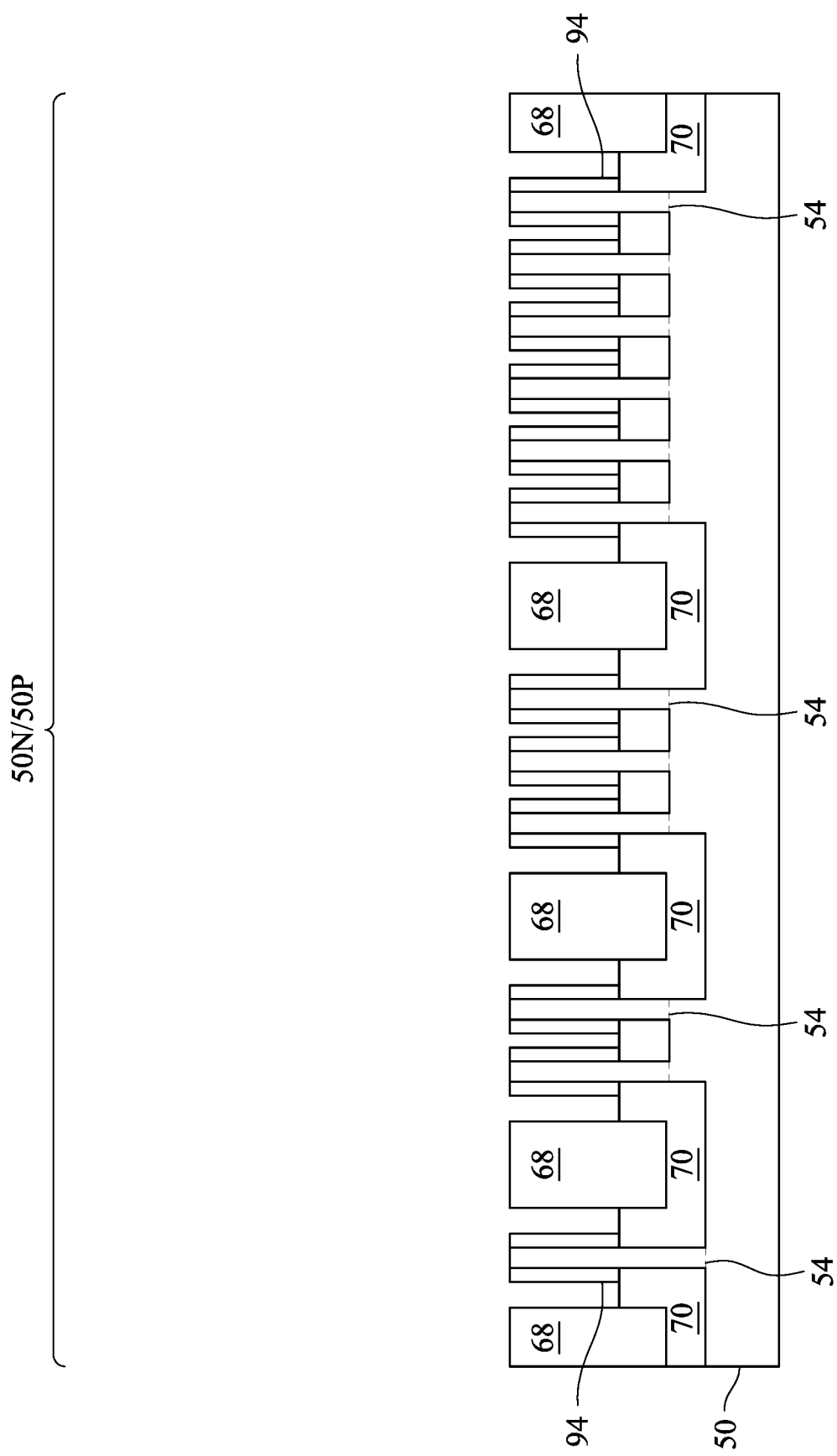

In FIGS. 10A-10C, the mask layer 76 is patterned using acceptable photolithography and etching techniques to form masks 86. The pattern of the masks 86 is then transferred to the dummy gate layer 74 by any acceptable etching technique to form dummy gates 84. The pattern of the masks 86 may optionally be further transferred to the dummy dielectric layer 72 by any acceptable etching technique to form dummy dielectrics 82. The dummy gates 84 cover respective channel regions 58 of the semiconductor fins 54. The pattern of the masks 86 may be used to physically separate adjacent dummy gates 84. The dummy gates 84 may have lengthwise directions substantially perpendicular (within process variations) to the lengthwise directions of the semiconductor fins 54. The masks 86 may be removed during the patterning of the dummy gate 84, or may be removed during subsequent processing.

Gate spacers 92 are formed over the semiconductor fins 54, on exposed sidewalls of the masks 86 (if present), the dummy gates 84, and the dummy dielectrics 82. The gate spacers 92 may be formed by conformally depositing one or more dielectric material(s) and subsequently etching the dielectric material(s). Acceptable dielectric materials may include silicon oxide, silicon nitride, silicon oxynitride, silicon oxycarbonitride, or the like, which may be formed by a conformal deposition process such as chemical vapor deposition (CVD), plasma-enhanced chemical vapor deposition (PECVD), atomic layer deposition (ALD), plasma-enhanced atomic layer deposition (PEALD), or the like. Other insulation materials formed by any acceptable process may be used. Any acceptable etch process, such as a dry etch, a wet etch, the like, or a combination thereof, may be performed to pattern the dielectric material(s). The etching may be anisotropic. The dielectric material(s), when etched, have portions left on the sidewalls of the dummy gates 84 (thus forming the gate spacers 92). In some embodiments the etch used to form the gate spacers 92 is adjusted so that the dielectric material(s), when etched, also have portions left on the sidewalls of the semiconductor fins 54 (thus forming fin spacers 94). After etching, the fin spacers 94 (if present) and the gate spacers 92 can have straight sidewalls (as illustrated) or can have curved sidewalls (not separately illustrated).

Further, implants may be performed to form lightly doped source/drain (LDD) regions (not separately illustrated). In the embodiments with different device types, similar to the implants for the wells previously described, a mask (not separately illustrated) such as a photoresist may be formed over the n-type region 50N, while exposing the p-type region 50P, and appropriate type (e.g., p-type) impurities may be implanted into the semiconductor fins 54 exposed in the p-type region 50P. The mask may then be removed. Subsequently, a mask (not separately illustrated) such as a photoresist may be formed over the p-type region 50P while exposing the n-type region 50N, and appropriate type impurities (e.g., n-type) may be implanted into the semiconductor fins 54 exposed in the n-type region 50N. The mask may then be removed. The n-type impurities may be any of the n-type impurities previously described, and the p-type impurities may be any of the p-type impurities previously described. During the implanting, the channel regions 58 remain covered by the dummy gates 84, so that the channel regions 58 remain substantially free of the impurity implanted to form the LDD regions. The LDD regions may have a concentration of impurities in the range of $10^{15}$ cm$^{-3}$ to $10^{19}$ cm$^{-3}$. An anneal may be used to repair implant damage and to activate the implanted impurities.

It is noted that the previous disclosure generally describes a process of forming spacers and LDD regions. Other processes and sequences may be used. For example, fewer or additional spacers may be utilized, different sequence of steps may be utilized, additional spacers may be formed and removed, and/or the like. Furthermore, the n-type devices and the p-type devices may be formed using different structures and steps.

Figure 11B:
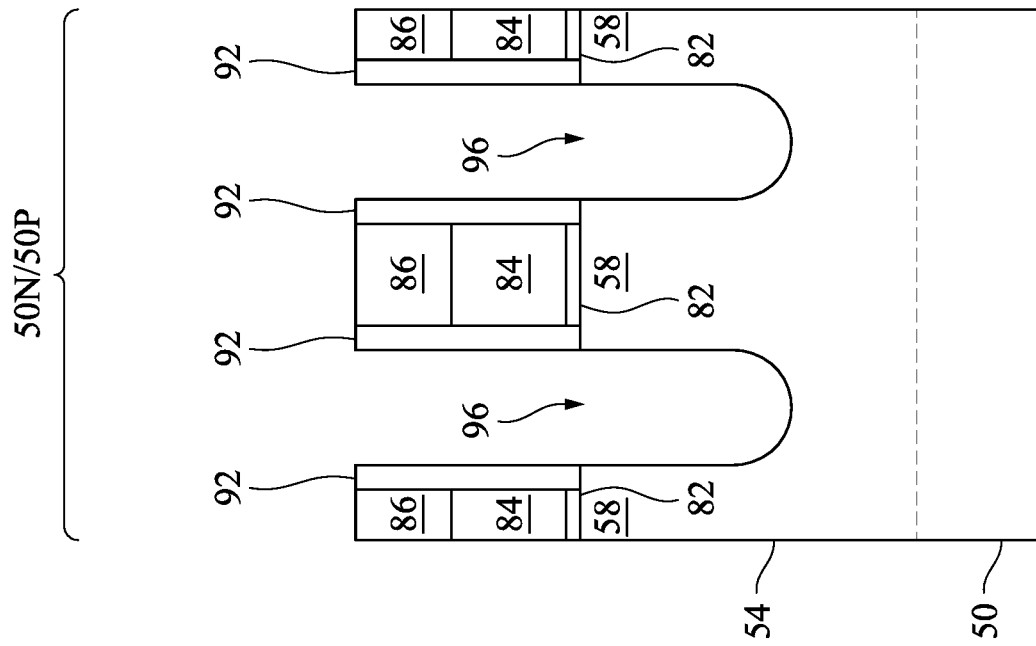
Figure 11A:
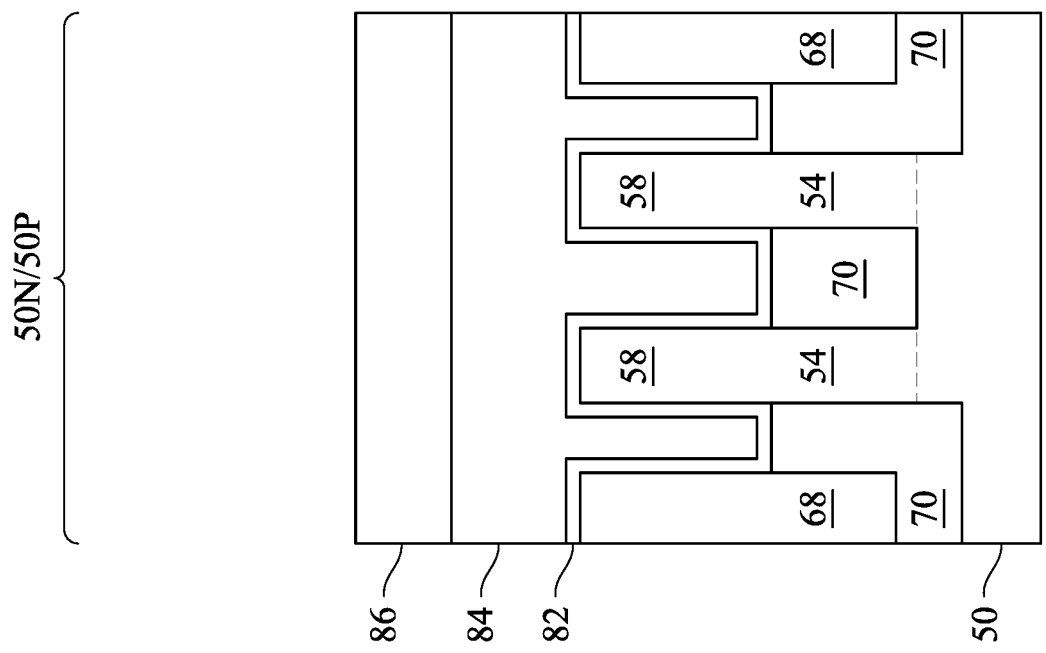
Figure 11C:
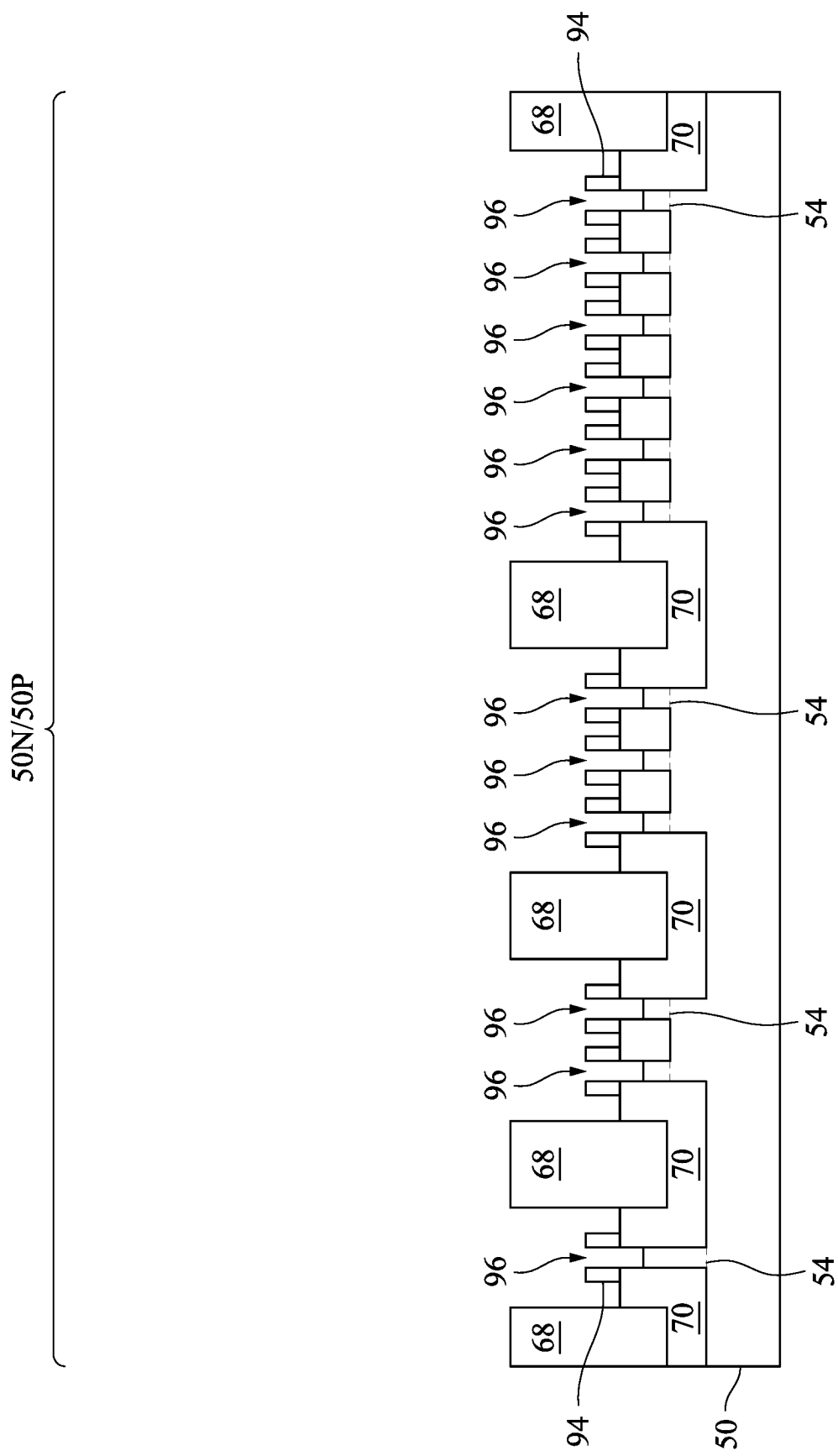

In FIGS. 11A-11C, source/drain recesses 96 are formed in the semiconductor fins 54. In the illustrated embodiment, the source/drain recesses 96 extend into the semiconductor fins 54. The source/drain recesses 96 may also extend into the substrate 50. In various embodiments, the source/drain recesses 96 may extend to a top surface of the substrate 50 without etching the substrate 50; the semiconductor fins 54 may be etched such that bottom surfaces of the source/drain recesses 96 are disposed below the top surfaces of the STI regions 70; or the like. The source/drain recesses 96 may be formed by etching the semiconductor fins 54 using an anisotropic etching processes, such as a RIE, a NBE, or the like. The etching process selectively etches the material(s) of the semiconductor fins 54 at a faster rate than the materials of the hybrid fins 68 and the STI regions 70. The gate spacers 92 and the dummy gates 84 collectively mask portions of the semiconductor fins 54 during the etching processes used to form the source/drain recesses 96. Timed etch processes may be used to stop the etching of the source/drain recesses 96 after the source/drain recesses 96 reach a desired depth. The fin spacers 94 (if present) may be etched during or after the etching of the source/drain recesses 96, so that the height of the fin spacers 94 is reduced. The size and dimensions of the source/drain regions that will be subsequently formed in the source/drain recesses 96 may be controlled by adjusting the height of the fin spacers 94. The hybrid fins 68 are not recessed, and remain after the source/drain recesses 96 are etched.

Figure 12B:
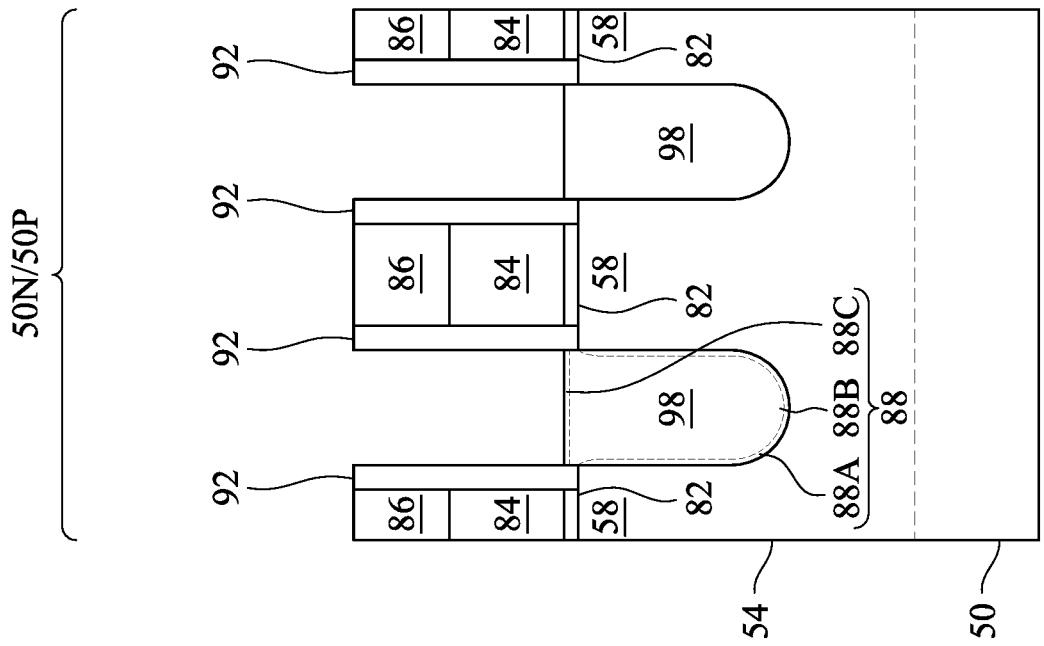
Figure 12A:
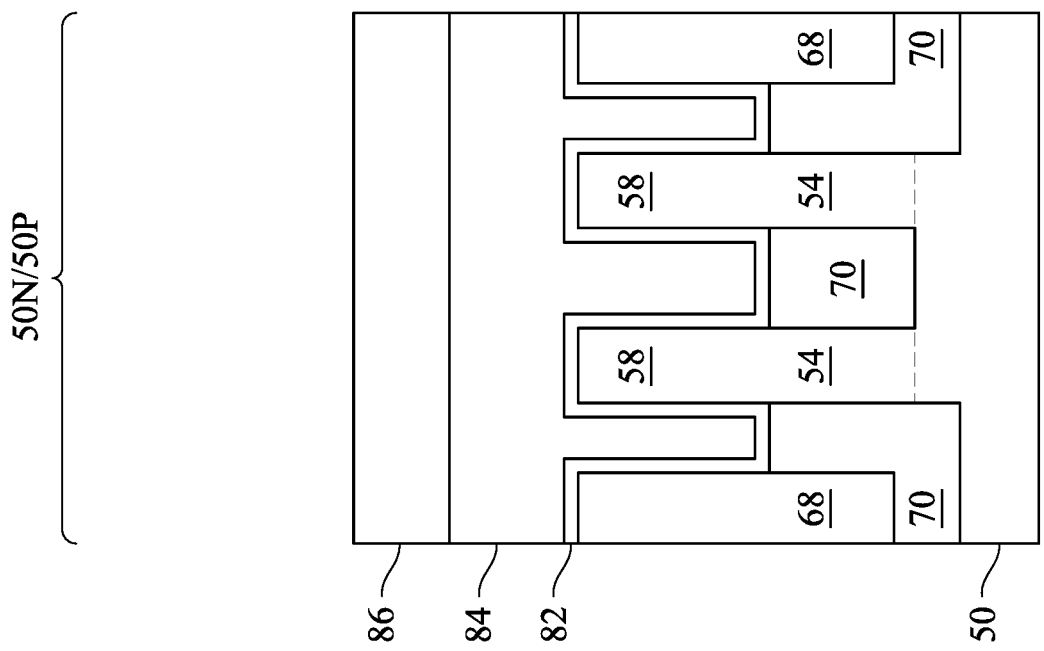
Figure 12C:
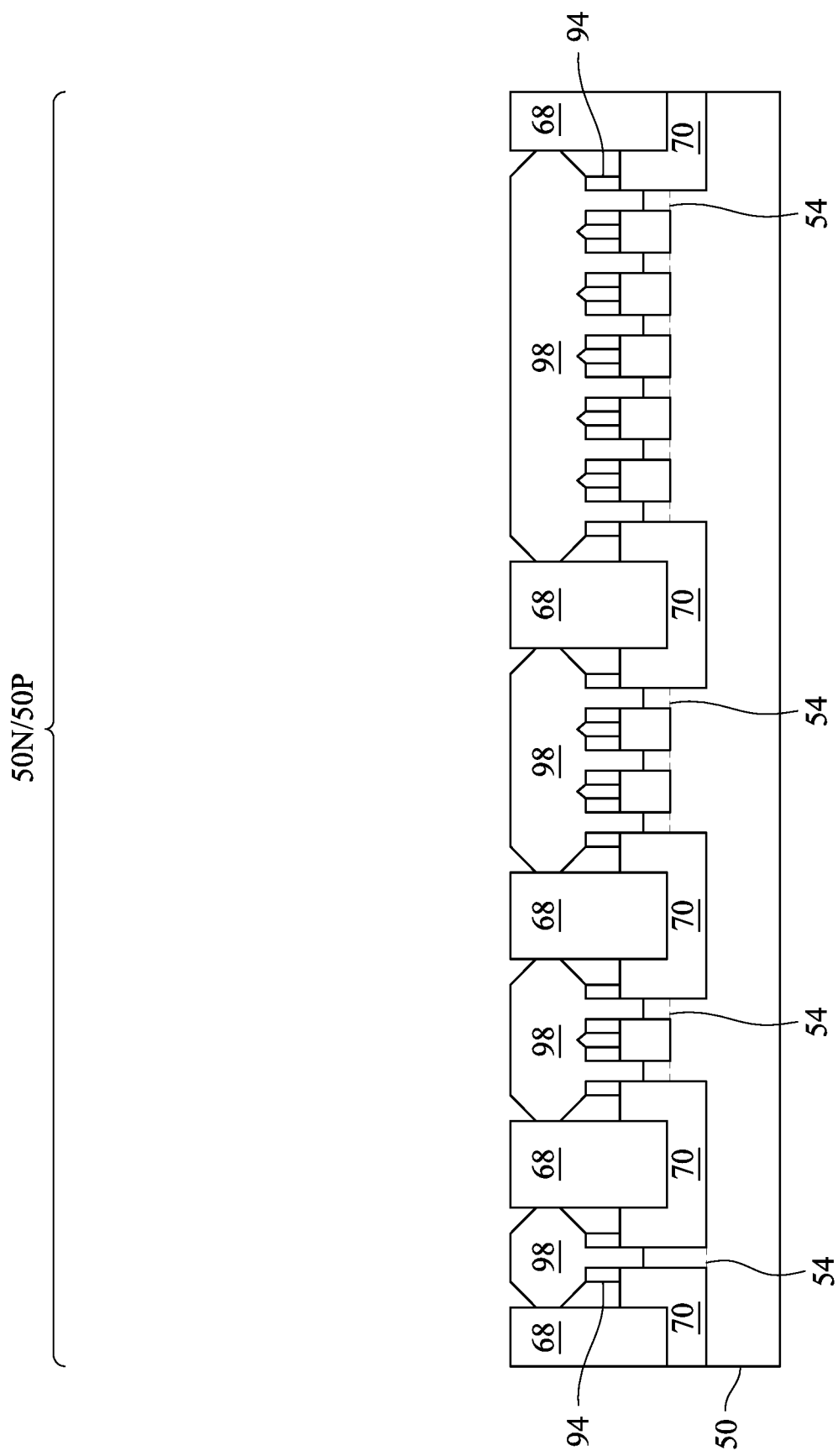

In FIGS. 12A-12C, epitaxial source/drain regions 98 are formed in the source/drain recesses 96. The epitaxial source/drain regions 98 are thus disposed in the semiconductor fins 54 such that each dummy gate 84 (and corresponding channel region 58) is between respective adjacent pairs of the epitaxial source/drain regions 98. The epitaxial source/drain regions 98 thus adjoin the channel regions 58. In some embodiments, the gate spacers 92 are used to separate the epitaxial source/drain regions 98 from the dummy gates 84 by an appropriate lateral distance so that the epitaxial source/drain regions 98 do not short out with subsequently formed gates of the resulting FinFETs. A material of the epitaxial source/drain regions 98 may be selected to exert stress in the respective channel regions 58, thereby improving performance.

The epitaxial source/drain regions 98 in the n-type region 50N may be formed by masking the p-type region 50P. Then, the epitaxial source/drain regions 98 in the n-type region 50N are epitaxially grown in the source/drain recesses 96 in the n-type region 50N. The epitaxial source/drain regions 98 may include any acceptable material appropriate for n-type devices. For example, if the semiconductor fins 54 are silicon, the epitaxial source/drain regions 98 in the n-type region 50N may include materials exerting a tensile strain on the channel regions 58, such as silicon, silicon carbide, phosphorous doped silicon carbide, silicon phosphide, or the like. The epitaxial source/drain regions 98 in the n-type region 50N may be referred to as "n-type source/drain regions." The epitaxial source/drain regions 98 in the n-type region 50N may have surfaces raised from respective surfaces of the semiconductor fins 54 and may have facets.

The epitaxial source/drain regions 98 in the p-type region 50P may be formed by masking the n-type region 50N. Then, the epitaxial source/drain regions 98 in the p-type region 50P are epitaxially grown in the source/drain recesses 96 in the p-type region 50P. The epitaxial source/drain regions 98 may include any acceptable material appropriate for p-type devices. For example, if the semiconductor fins 54 are silicon, the epitaxial source/drain regions 98 in the p-type region 50P may include materials exerting a compressive strain on the channel regions 58, such as silicon germanium, boron doped silicon germanium, germanium, germanium tin, or the like. The epitaxial source/drain regions 98 in the p-type region 50P may be referred to as "p-type source/drain regions." The epitaxial source/drain regions 98 in the p-type region 50P may have surfaces raised from respective surfaces of the semiconductor fins 54 and may have facets.

The epitaxial source/drain regions 98 and/or the semiconductor fins 54 may be implanted with impurities to form source/drain regions, similar to the process previously described for forming LDD regions, followed by an anneal. The source/drain regions may have an impurity concentration in the range of $10^{19}$ cm$^{-3}$ to $10^{21}$ cm$^{-3}$. The n-type and/or p-type impurities for source/drain regions may be any of the impurities previously described. In some embodiments, the epitaxial source/drain regions 98 may be in situ doped during growth.

The epitaxial source/drain regions 98 may include one or more semiconductor material layers. For example, the epitaxial source/drain regions 98 may each include a liner layer 98A, a main layer 98B, and a finishing layer 98C (or more generally, a first semiconductor material layer, a second semiconductor material layer, and a third semiconductor material layer). Any number of semiconductor material layers may be used for the epitaxial source/drain regions 98. In embodiments in which the epitaxial source/drain regions 98 include three semiconductor material layers, the liner layers 98A may be grown in the source/drain recesses 96, the main layers 98B may be grown on the liner layers 98A, and the finishing layers 98C may be grown on the main layers 98B. The liner layers 98A, the main layers 98B, and the finishing layers 98C may be formed of different semiconductor materials and may be doped to different impurity concentrations. In some embodiments, the main layers 98B have a greater concentration of impurities than the finishing layers 98C, and the finishing layers 98C have a greater concentration of impurities than the liner layers 98A. Forming the liner layers 98A with a lesser concentration of impurities than the main layers 98B may increase adhesion in the source/drain recesses 96, and forming the finishing layers 98C with a lesser concentration of impurities than the main layers 98B may reduce out-diffusion of dopants from the main layers 98B during subsequent processing.

As a result of the epitaxy processes used to form the epitaxial source/drain regions 98, upper surfaces of the epitaxial source/drain regions 98 have facets which expand laterally outward beyond sidewalls of the semiconductor fins 54. In some embodiments, these facets cause adjacent epitaxial source/drain regions 98 to merge as illustrated by FIG. 12C. However, the hybrid fins 68 (where present) block the lateral epitaxial growth to prevent coalescing of some of the epitaxial source/drain regions 98. For example, the hybrid fins 68 may be formed at cell boundaries to separate the epitaxial source/drain regions 98 of adjacent cells. Therefore, some of the epitaxial source/drain regions 98 are separated by the hybrid fins 68. The epitaxial source/drain regions 98 may contact the sidewalls of the hybrid fins 68. In the illustrated embodiments, the fin spacers 94 are formed to cover a portion of the sidewalls of the semiconductor fins 54 that extend above the STI regions 70, thereby blocking the epitaxial growth. In another embodiment, the spacer etch used to form the gate spacers 92 is adjusted to not form the fin spacers 94, so as to allow the epitaxial source/drain regions 98 to extend to the surfaces of the STI regions 70.

Figure 13A:
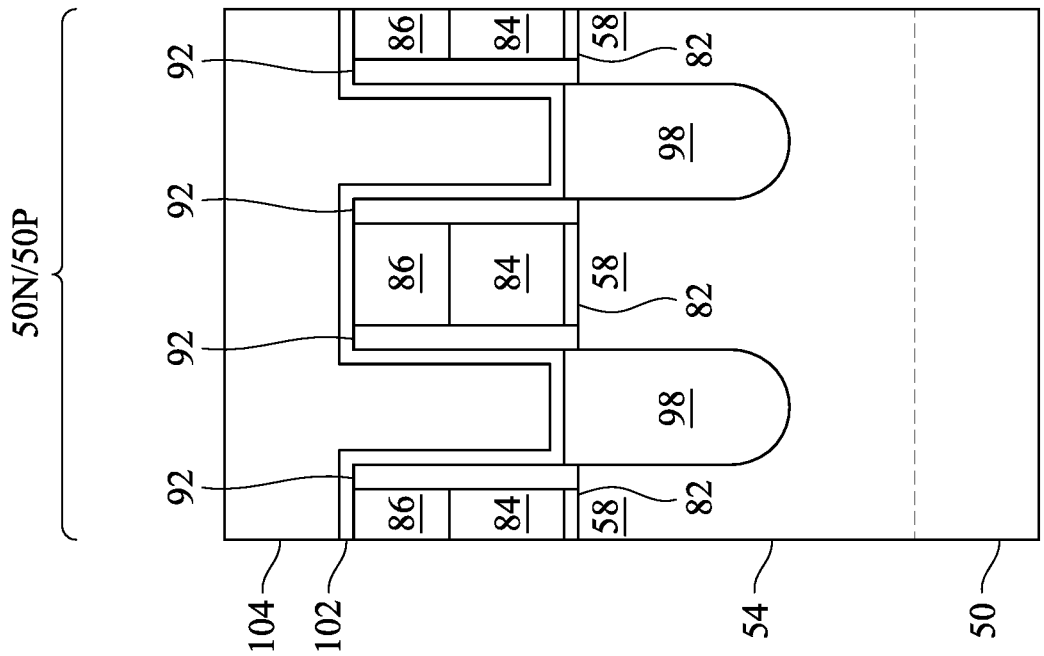
Figure 13B:
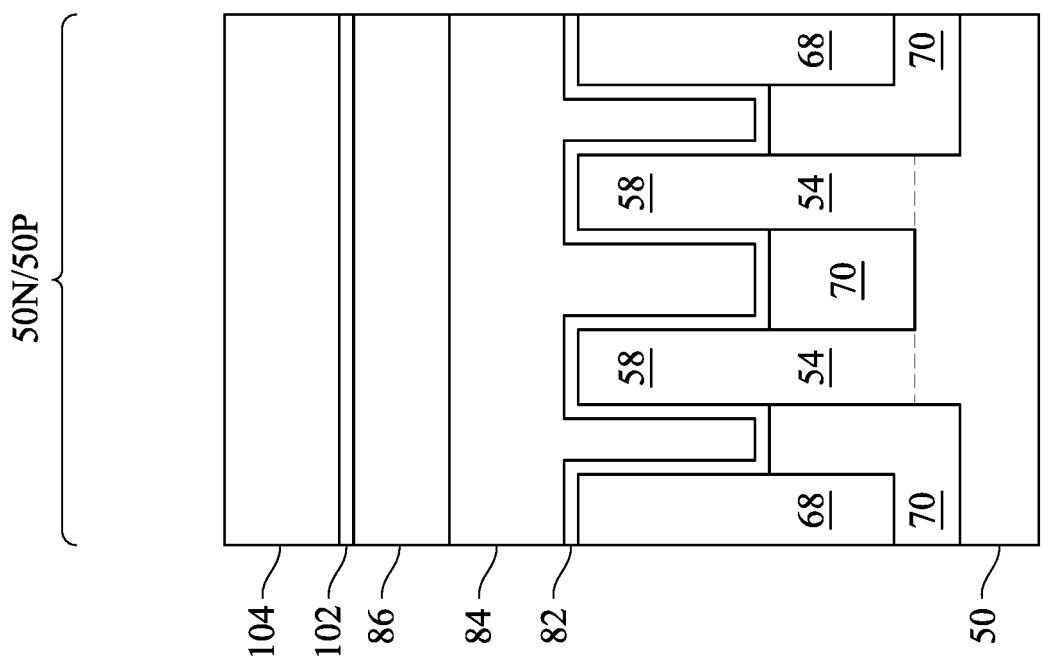
Figure 13C:
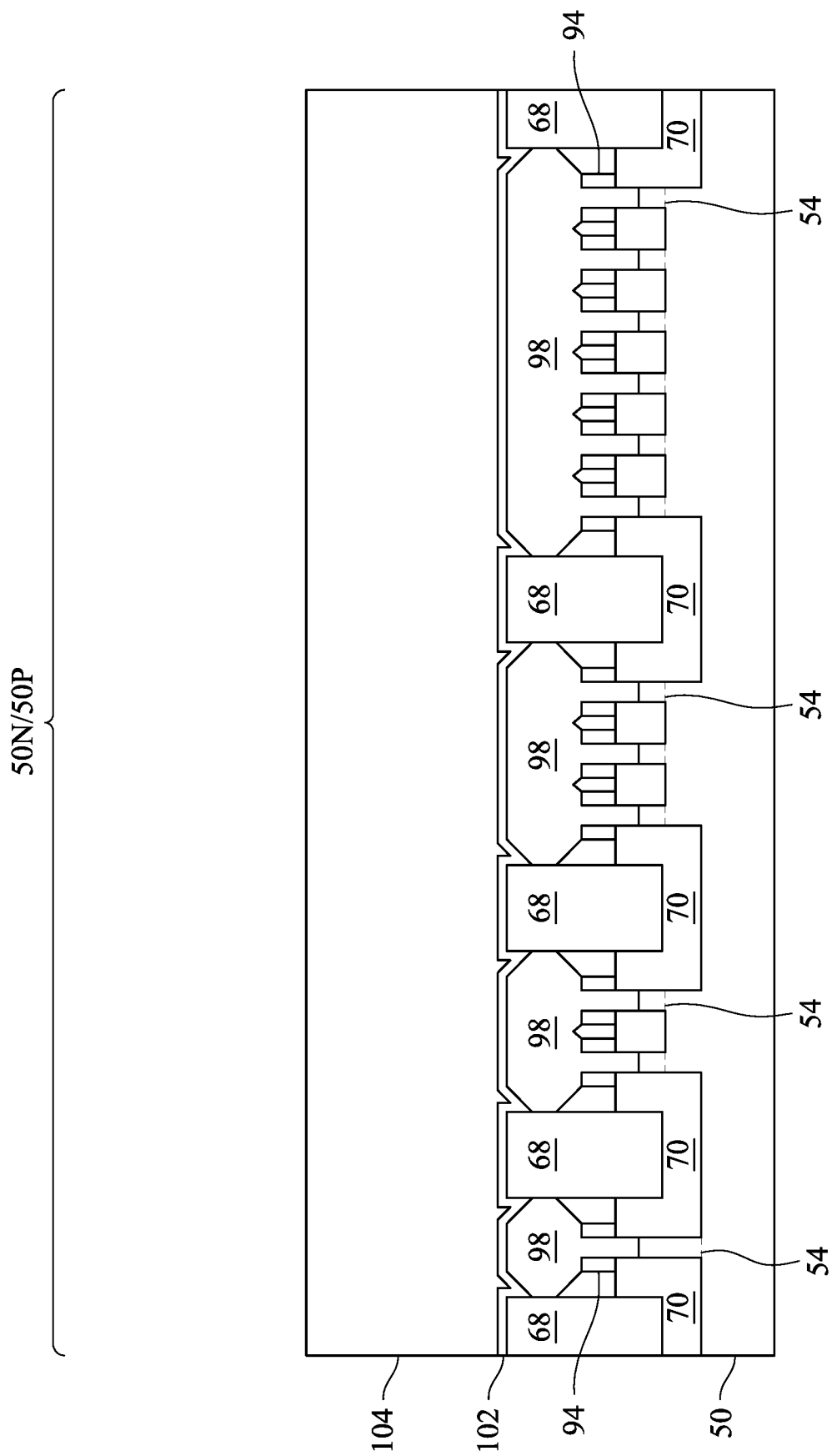

In FIGS. 13A-13C, a first ILD 104 is deposited over the epitaxial source/drain regions 98, the gate spacers 92, the masks 86 (if present) or the dummy gates 84, and the hybrid fins 68. The first ILD 104 may be formed of a dielectric material, which may be deposited by any suitable method, such as CVD, plasma-enhanced CVD (PECVD), FCVD, or the like. Acceptable dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used.

In some embodiments, a contact etch stop layer (CESL) 102 is formed between the first ILD 104 and the epitaxial source/drain regions 98, the gate spacers 92, the masks 86 (if present) or the dummy gates 84, and the hybrid fins 68. The CESL 102 may be formed of a dielectric material, such as silicon nitride, silicon oxide, silicon oxynitride, or the like, having a high etching selectivity from the etching of the first ILD 104. The CESL 102 may be formed by any suitable method, such as CVD, ALD, or the like.

Figure 14B:
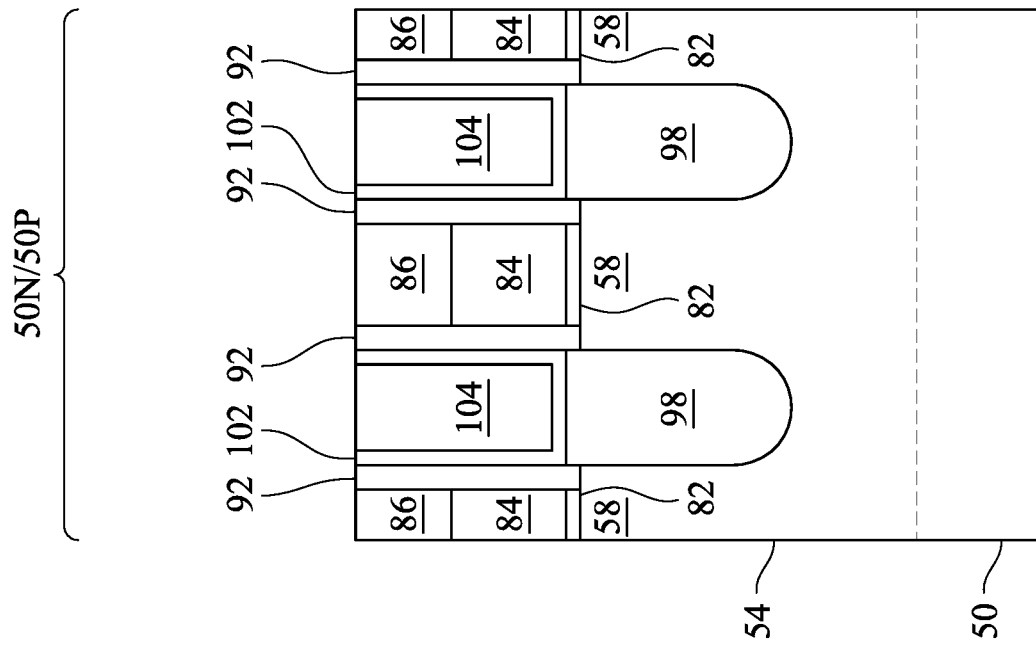
Figure 14A:
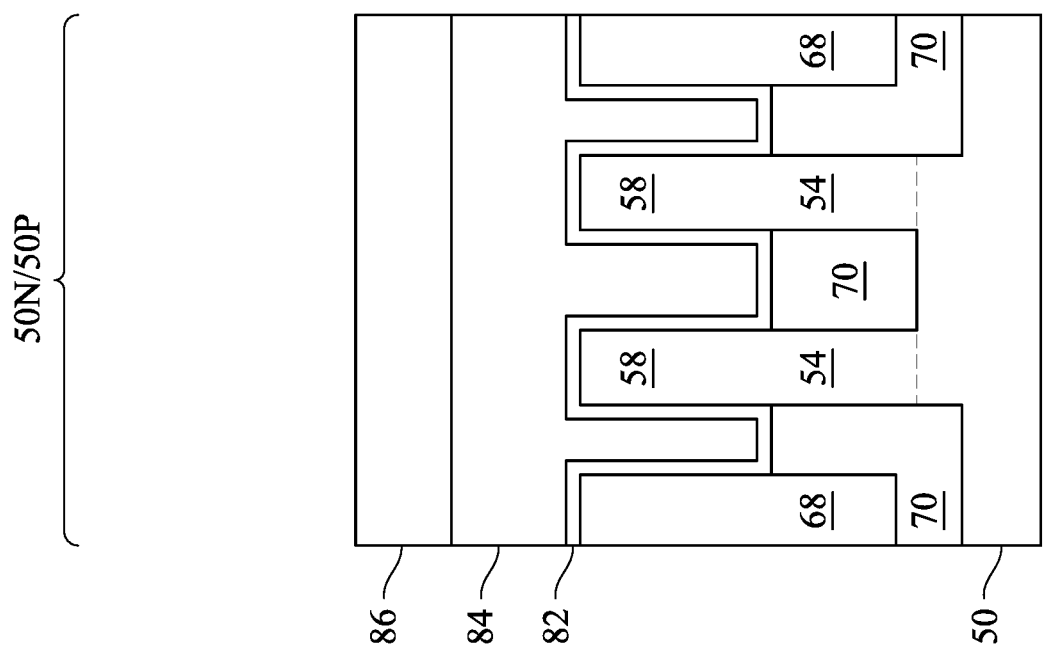
Figure 14C:
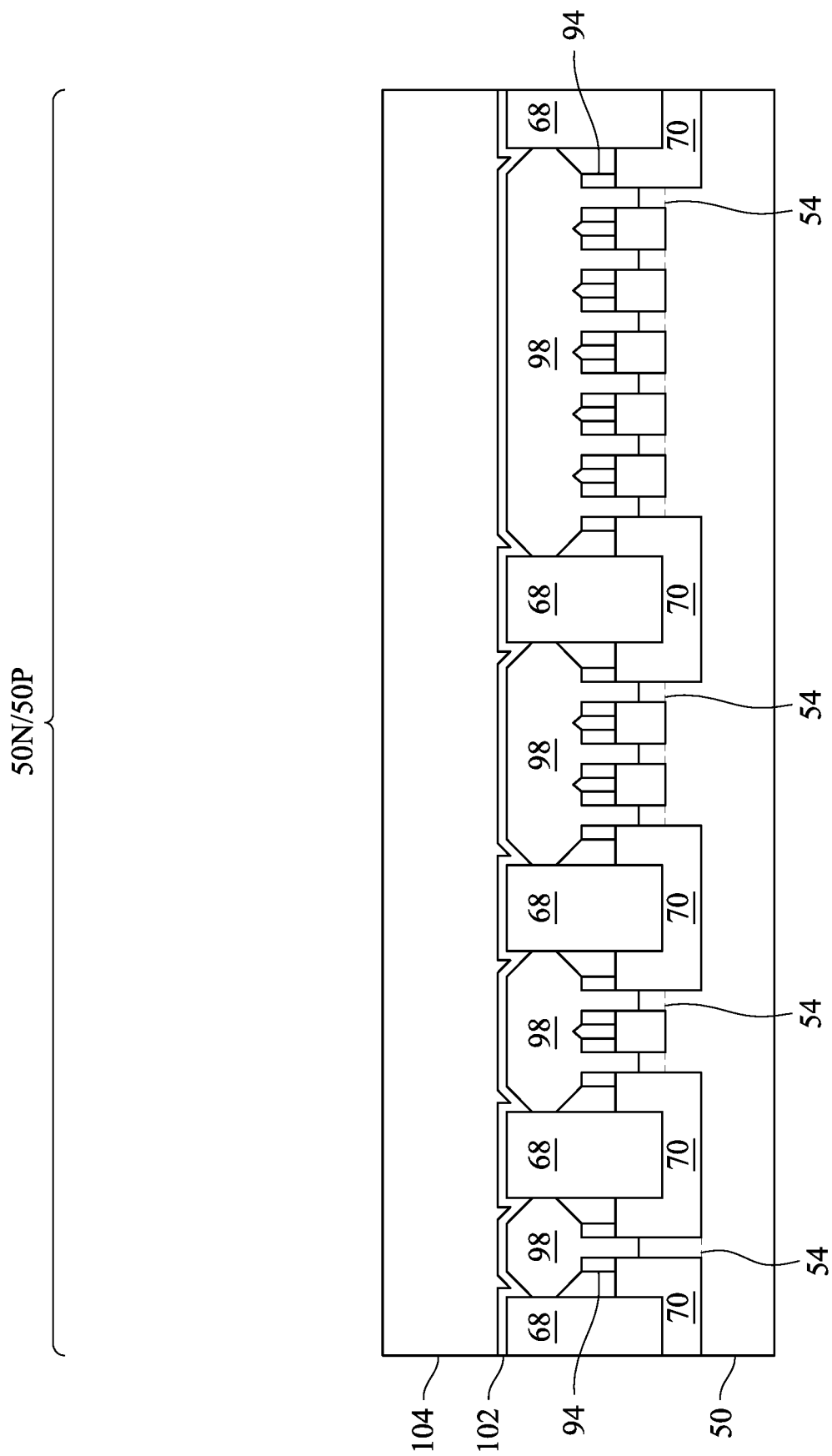

In FIGS. 14A-14C, a removal process is performed to level the top surfaces of the first ILD 104 with the top surfaces of the gate spacers 92 and the masks 86 (if present) or the dummy gates 84. In some embodiments, a planarization process such as a chemical mechanical polish (CMP), an etch-back process, combinations thereof, or the like may be utilized. The planarization process may also remove the masks 86 on the dummy gates 84, and portions of the gate spacers 92 along sidewalls of the masks 86. After the planarization process, the top surfaces of the first ILD 104, the CESL 102, the gate spacers 92, and the masks 86 (if present) or the dummy gates 84 are coplanar (within process variations), such that they are level with one another. Accordingly, the top surfaces of the masks 86 (if present) or the dummy gates 84 are exposed through the first ILD 104. In the illustrated embodiment, the masks 86 remain, and the planarization process levels the top surfaces of the first ILD 104 with the top surfaces of the masks 86.

Figure 15B:
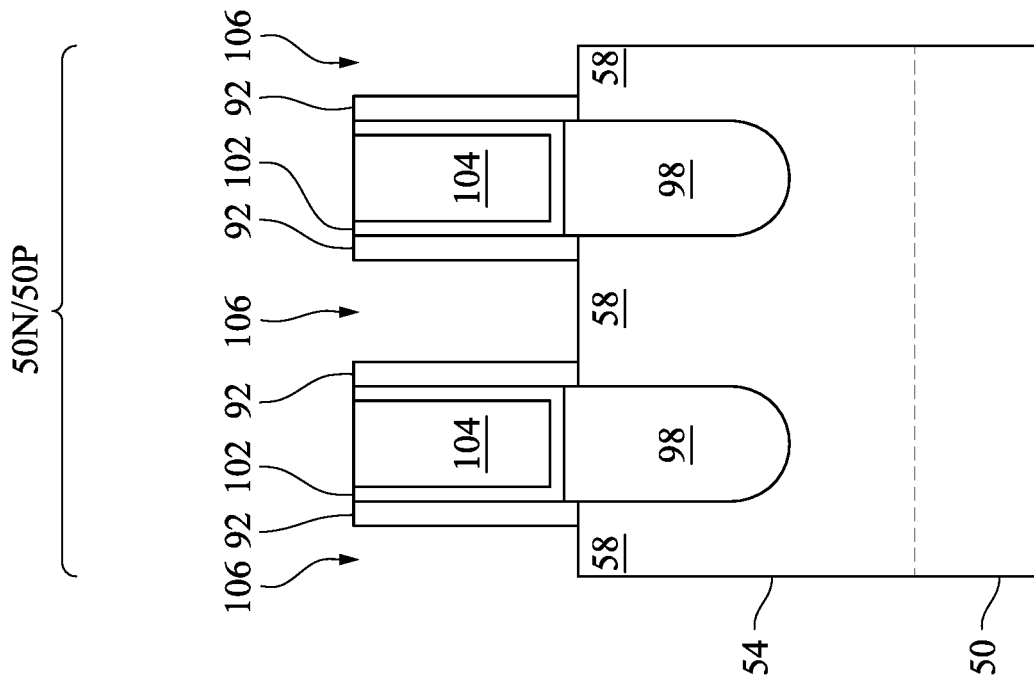
Figure 15A:
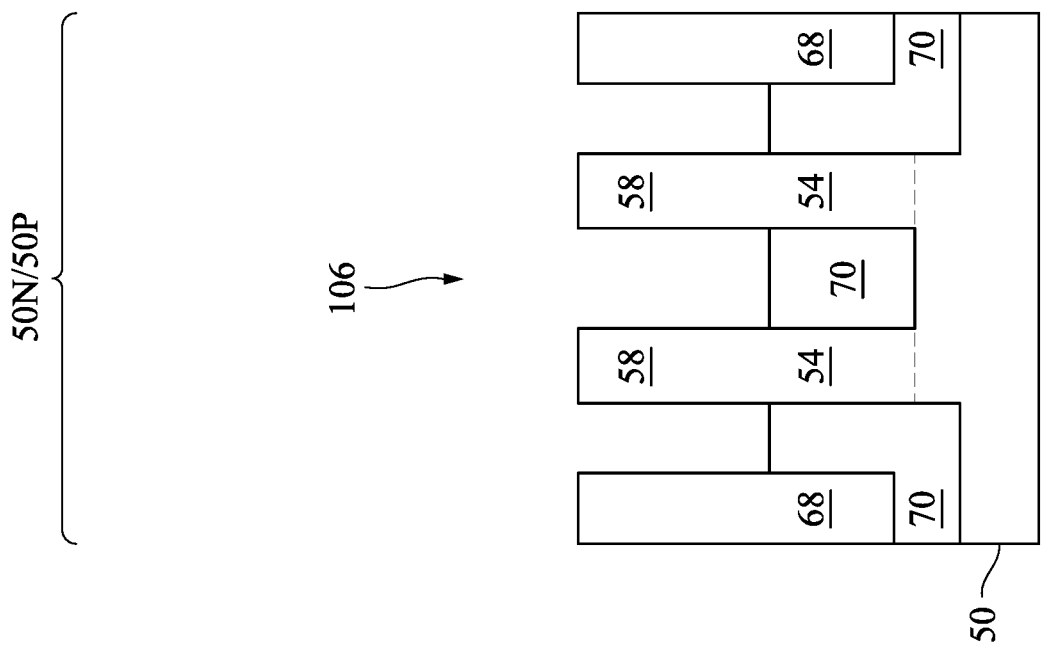
Figure 15C:
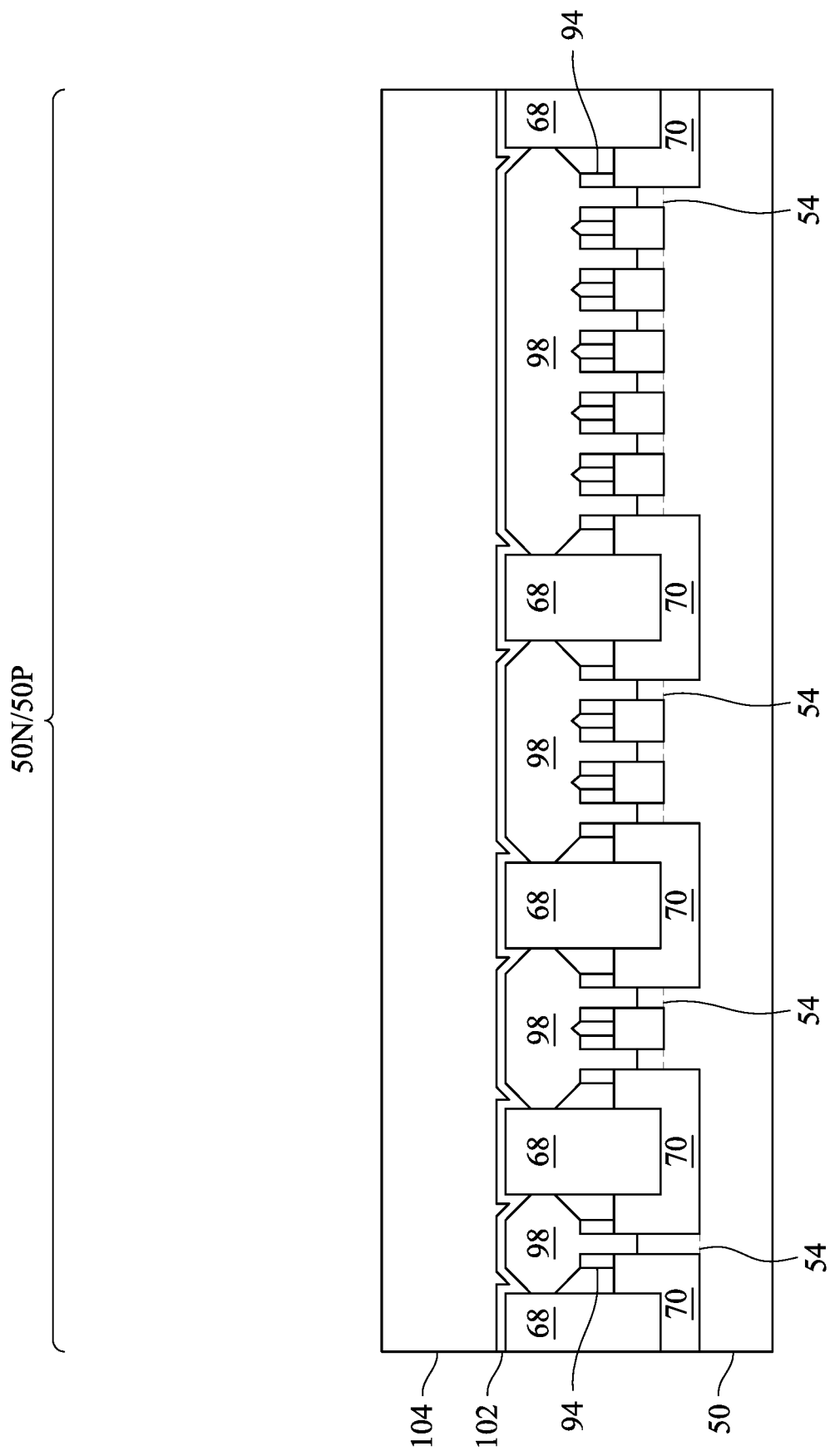

In FIGS. 15A-15C, the masks 86 (if present) and the dummy gates 84 are removed in an etching process, so that recesses 106 are formed. Portions of the dummy dielectrics 82 in the recesses 106 may also be removed. In some embodiments, only the dummy gates 84 are removed and the dummy dielectrics 82 remain and are exposed by the recesses 106. In some embodiments, the dummy dielectrics 82 are removed from recesses 106 in a first region of a die (e.g., a core logic region) and remain in recesses 106 in a second region of the die (e.g., an input/output region). In some embodiments, the dummy gates 84 are removed by an anisotropic dry etch process. For example, the etching process may include a dry etch process using reaction gas(es) that selectively etch the material of the dummy gates 84 at a faster rate than the materials of the first ILD 104 and the gate spacers 92. During the removal, the dummy dielectrics 82 may be used as etch stop layers when the dummy gates 84 are etched. The dummy dielectrics 82 may then be optionally removed after the removal of the dummy gates 84. Each recess 106 exposes and/or overlies a channel region 58 of a respective semiconductor fin 54. The recesses 106 may also expose the hybrid fins 68 (when the dummy dielectrics 82 are removed).

Figure 16B:
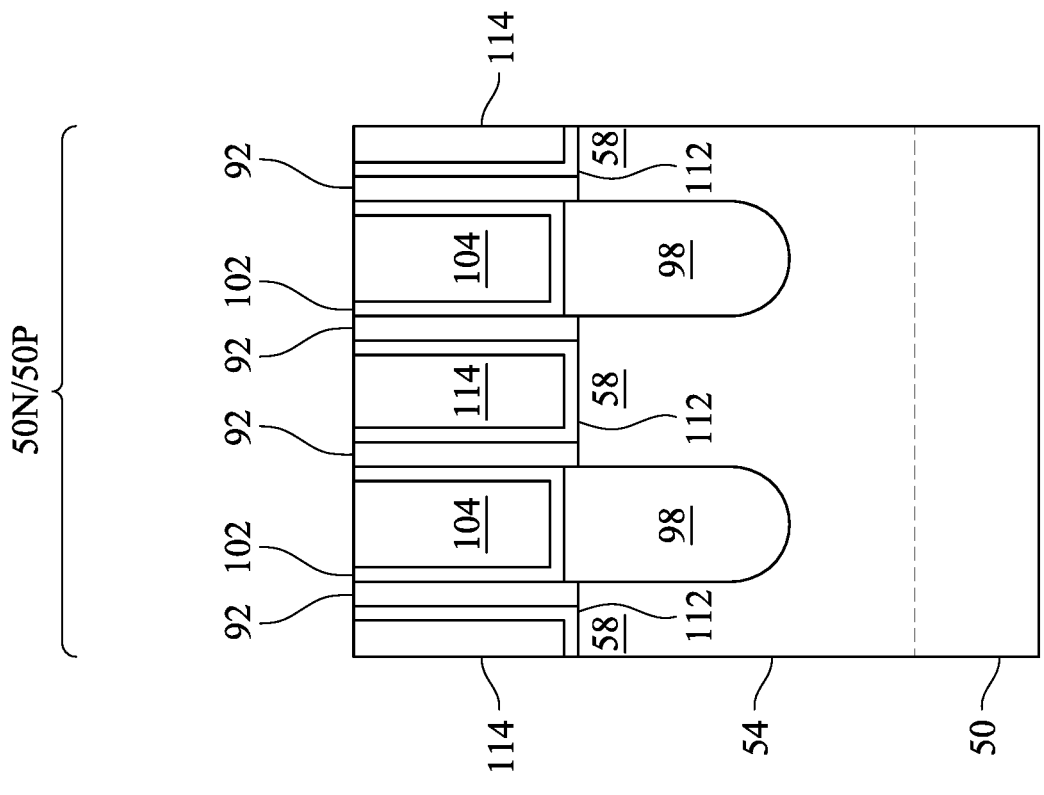
Figure 16A:
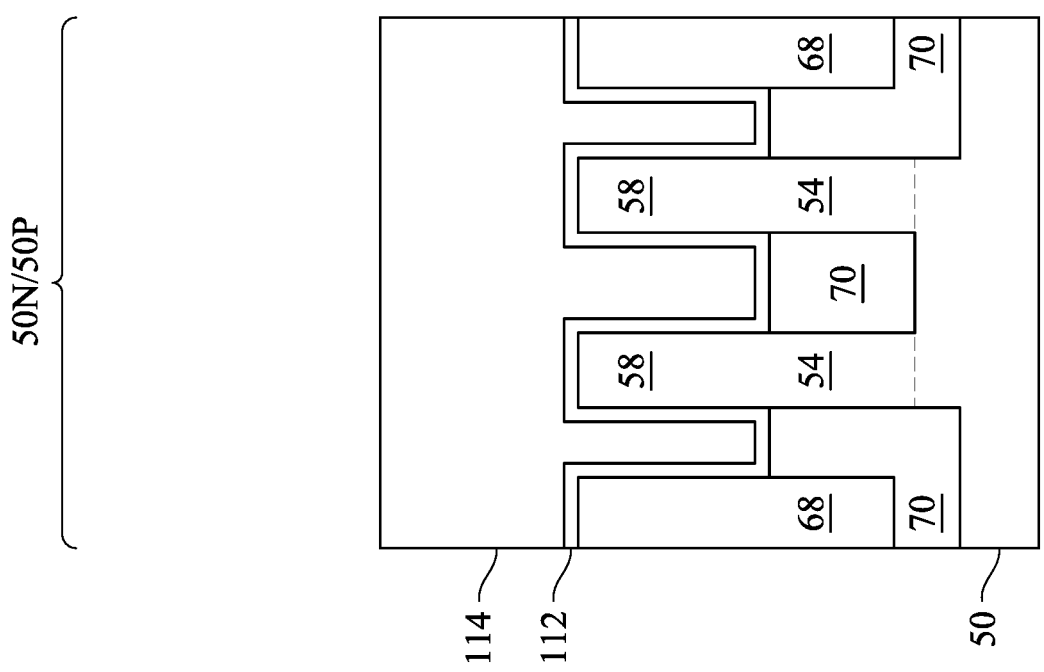
Figure 16C:
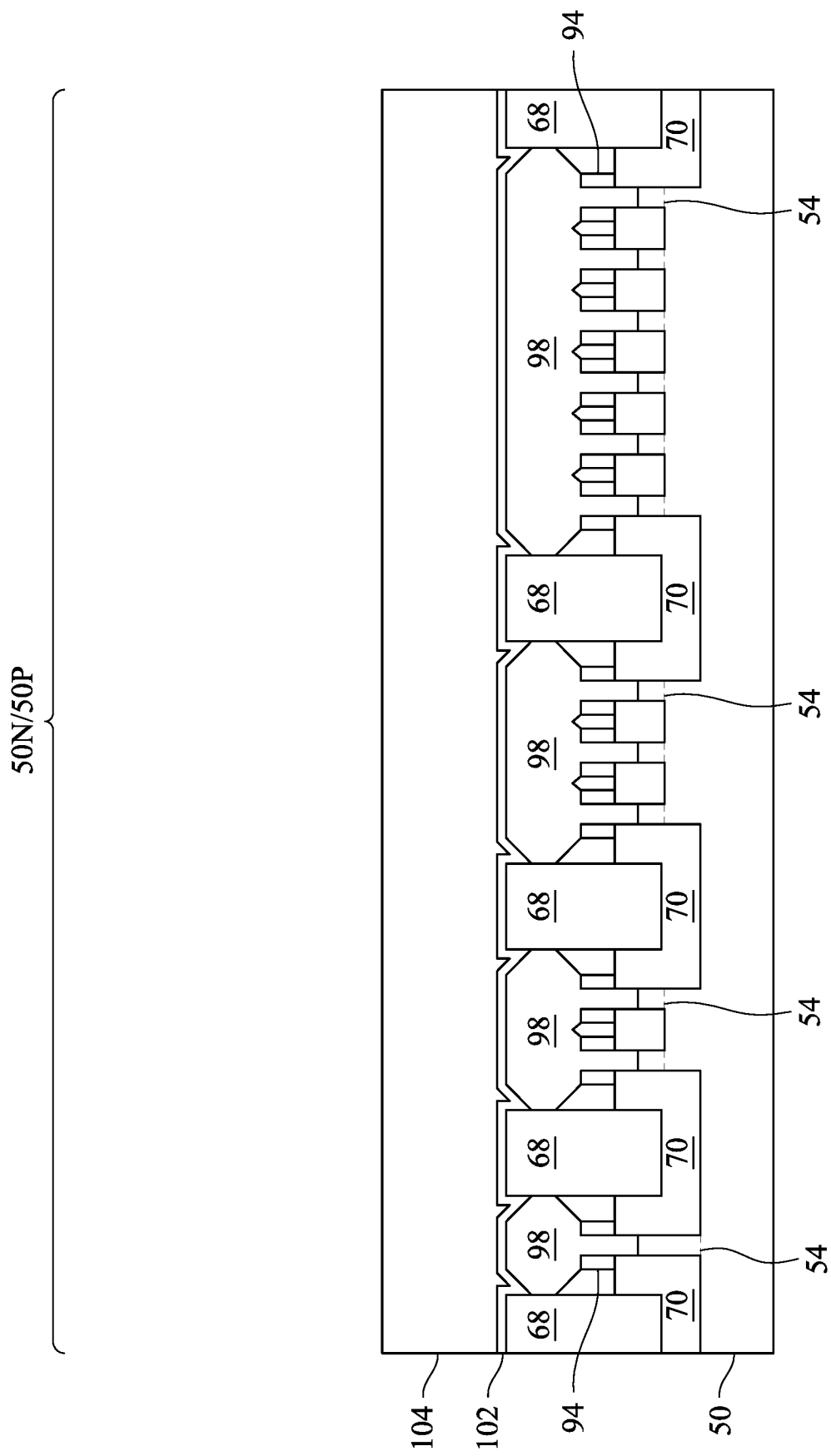

In FIGS. 16A-16C, gate dielectrics 112 and gate electrodes 114 are formed for replacement gates. Each respective pair of a gate dielectric 112 and a gate electrode 114 may be collectively referred to as a "gate structure." Each gate structure extends along sidewalls and a top surface of a channel region 58 of the semiconductor fins 54. Some of the gate structures further extend along sidewalls and a top surface of a hybrid fin 68.

The gate dielectrics 112 include one or more gate dielectric layer(s) disposed in the recesses 106, such as on the top surfaces and the sidewalls of the semiconductor fins 54, on the top surfaces and the sidewalls of the hybrid fins 68, and on sidewalls of the gate spacers 92. The gate dielectrics 112 may include an oxide such as silicon oxide or a metal oxide, a silicate such as a metal silicate, combinations thereof, multi-layers thereof, or the like. The gate dielectrics 112 may include a high-k dielectric material, such as a metal oxide or a silicate of hafnium, aluminum, zirconium, lanthanum, manganese, barium, titanium, lead, and combinations thereof. The dielectric material(s) of the gate dielectrics 112 may be formed by molecular-beam deposition (MBD), ALD, PECVD, or the like. In embodiments where portions of the dummy dielectrics 82 remain in the recesses 106, the gate dielectrics 112 includes a material of the dummy dielectrics 82 (e.g., silicon oxide). Although a single-layered gate dielectrics 112 are illustrated, the gate dielectrics 112 may include any number of interfacial layers and any number of main layers. For example, the gate dielectrics 112 may include an interfacial layer and an overlying high-k dielectric layer.

The gate electrodes 114 include one or more gate electrode layer(s) disposed over the gate dielectrics 112, which fill the remaining portions of the recesses 106. The gate electrodes 114 may include a metal-containing material such as titanium nitride, titanium oxide, tantalum nitride, tantalum carbide, tungsten, cobalt, ruthenium, aluminum, combinations thereof, multi-layers thereof, or the like. Although single-layered gate electrodes 114 are illustrated, the gate electrodes 114 may include any number of work function tuning layers, any number of barrier layers, any number of glue layers, and a fill material.

As an example to form the gate structures, one or more gate dielectric layer(s) may be deposited in the recesses 106. The gate dielectric layer(s) may also be deposited on the top surfaces of the first ILD 104, the CESL 102, and the gate spacers 92. Subsequently, one or more gate electrode layer(s) may be deposited on the gate dielectric layer(s). A removal process may then be performed to remove the excess portions of the gate dielectric layer(s) and the gate electrode layer(s), which excess portions are over the top surfaces of the first ILD 104, the CESL 102, and the gate spacers 92. The gate dielectric layer(s), after the removal process, have portions left in the recesses 106 (thus forming the gate dielectrics 112). The gate electrode layer(s), after the removal process, have portions left in the recesses 106 (thus forming the gate electrodes 114). In some embodiments, a planarization process such as a chemical mechanical polish (CMP), an etch-back process, combinations thereof, or the like may be utilized. After the planarization process, the top surfaces of the gate spacers 92, the CESL 102, the first ILD 104, the gate dielectrics 112, and the gate electrodes 114 are coplanar (within process variations), such that they are level with one another.

The formation of the gate dielectrics 112 in the n-type region 50N and the p-type region 50P may occur simultaneously such that the gate dielectrics 112 in each region are formed of the same material(s), and the formation of the gate electrodes 114 may occur simultaneously such that the gate electrodes 114 in each region are formed of the same material(s). In some embodiments, the gate dielectrics 112 in each region may be formed by distinct processes, such that the gate dielectrics 112 may include different materials and/or have a different number of layers, and/or the gate electrodes 114 in each region may be formed by distinct processes, such that the gate electrodes 114 may include different materials and/or have a different number of layers.

Various masking steps may be used to mask and expose appropriate regions when using distinct processes.

Figure 17B:
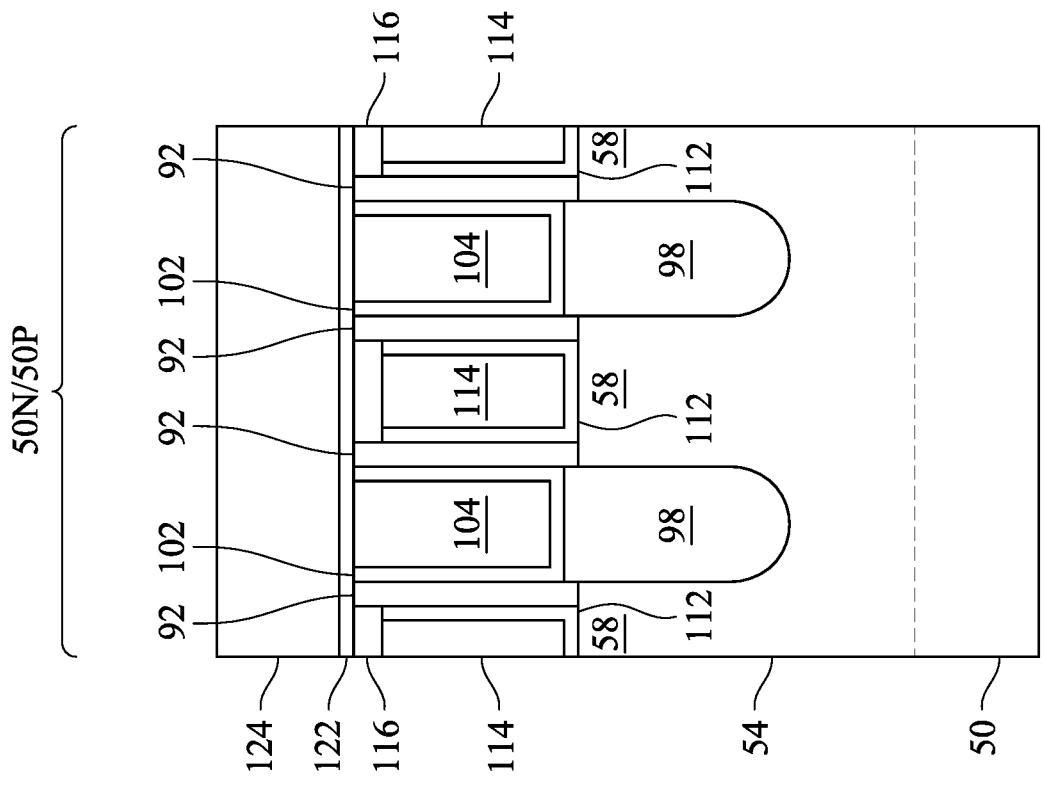
Figure 17A:
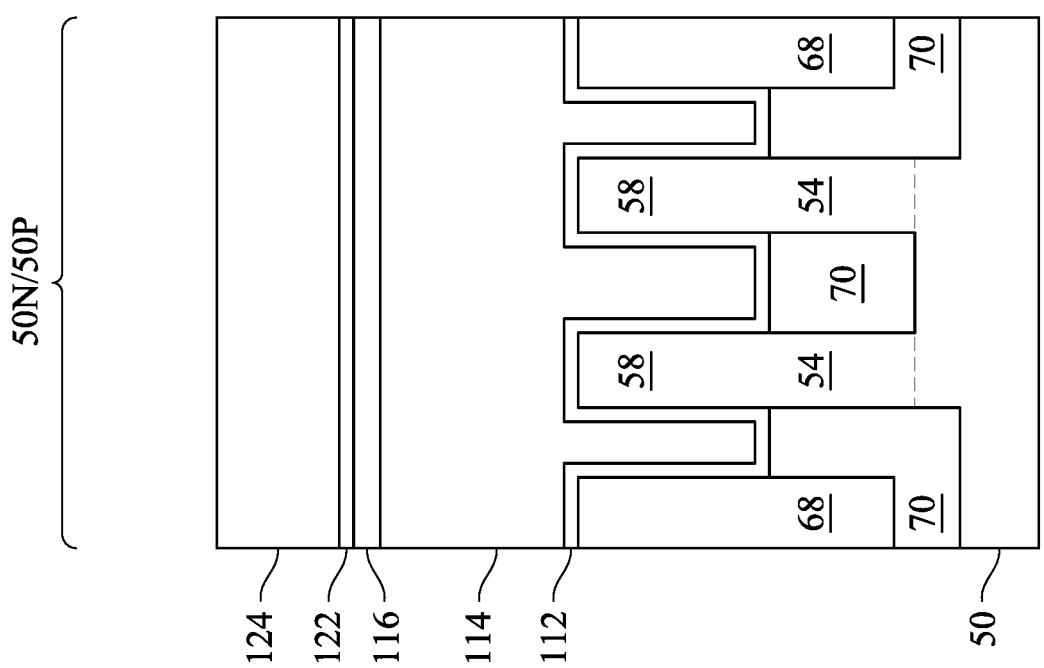
Figure 17C:
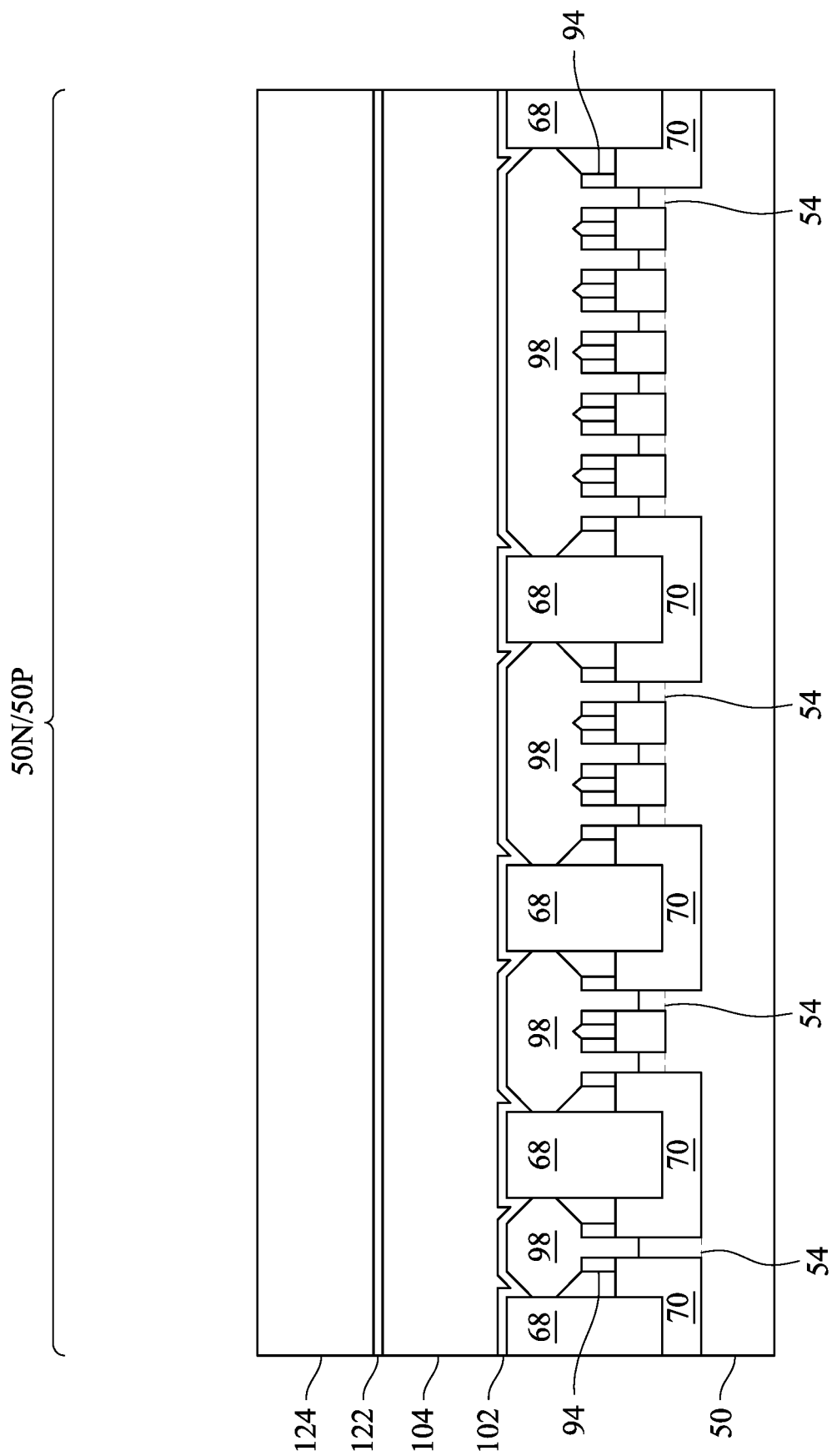

In FIGS. 17A-17C, a second ILD 124 is deposited over the gate spacers 92, the CESL 102, the first ILD 104, the gate dielectrics 112, and the gate electrodes 114. In some embodiments, the second ILD 124 is a flowable film formed by a flowable CVD method. In some embodiments, the second ILD 124 is formed of a dielectric material such as PSG, BSG, BPSG, USG, or the like, which may be deposited by any suitable method, such as CVD, PECVD, or the like.

Optionally, before the formation of the second ILD 124, gate masks 116 are formed over the gate structures (including the gate dielectrics 112 and the gate electrodes 114). As an example to form the gate masks 116, the gate structures and optionally the gate spacers 92 may be recessed using any acceptable etching process. One or more dielectric material(s) may then be formed in the recesses and on the top surfaces of the CESL 102 and the first ILD 104. Acceptable dielectric materials include silicon nitride, silicon carbonitride, silicon oxynitride, silicon oxycarbonitride, or the like, which may be formed by a conformal deposition process such as chemical vapor deposition (CVD), plasma-enhanced chemical vapor deposition (PECVD), atomic layer deposition (ALD), plasma-enhanced atomic layer deposition (PEALD), or the like. Other insulation materials formed by any acceptable process may be used. A removal process is performed to remove the excess portions of the dielectric material(s), which excess portions are over the top surfaces of the CESL 102 and the first ILD 104, thereby forming the gate masks 116. The dielectric material(s), after the removal process, have portions left in the recesses (thus forming the gate masks 116). In some embodiments, a planarization process such as a chemical mechanical polish (CMP), an etch-back process, combinations thereof, or the like may be utilized. After the planarization process, the top surfaces of the CESL 102, the first ILD 104, and the gate masks 116 are coplanar (within process variations), such that they are level with one another. Gate contacts will be subsequently formed to penetrate through the gate masks 116 to contact the top surfaces of the gate electrodes 114.

In some embodiments, an etch stop layer (ESL) 122 is formed between the second ILD 124 and the gate spacers 92, the CESL 102, the first ILD 104, and the gate masks 116 (if present) or the gate dielectrics 112 and the gate electrodes 114. The ESL 122 may include a dielectric material, such as, silicon nitride, silicon oxide, silicon oxynitride, or the like, having a high etching selectivity from the etching of the second ILD 124.

Figure 18B:
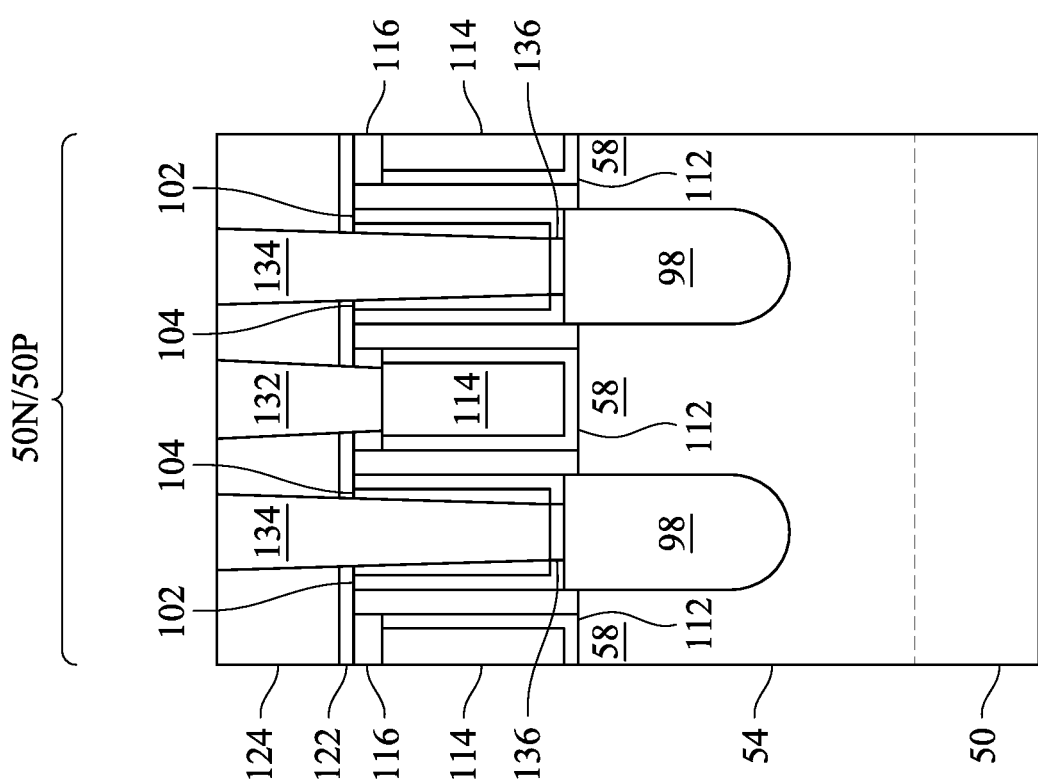
Figure 18A:
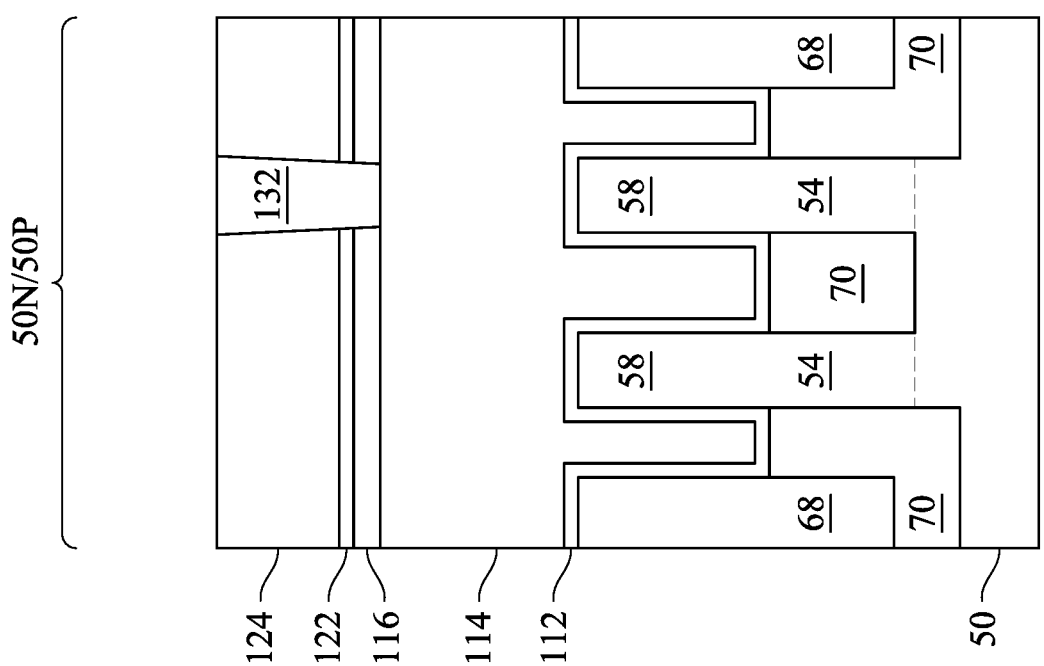
Figure 18C:
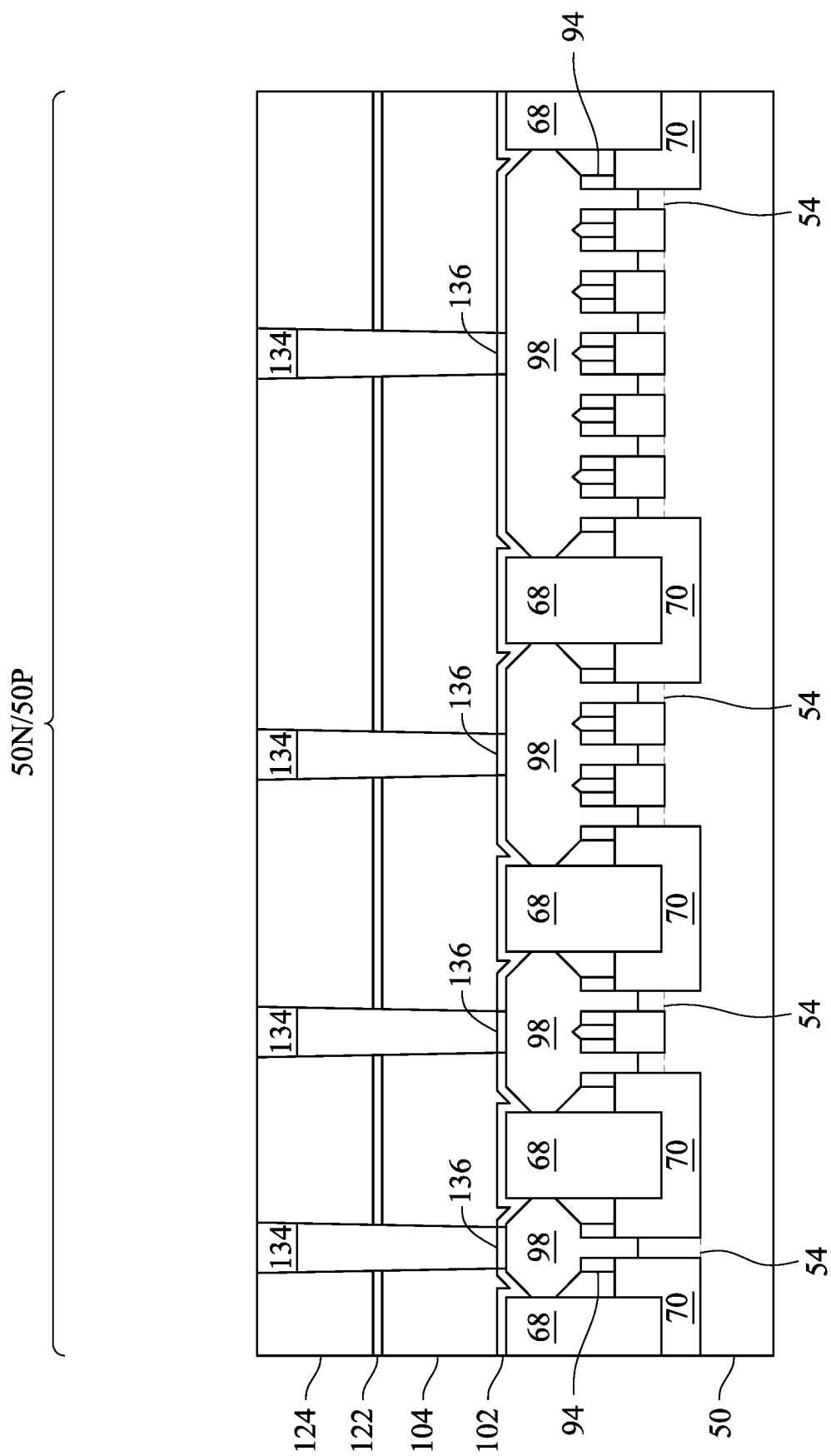

In FIGS. 18A-18C, gate contacts 132 and source/drain contacts 134 are formed to contact, respectively, the gate electrodes 114 and the epitaxial source/drain regions 98. The gate contacts 132 are physically and electrically coupled to the gate electrodes 114. The source/drain contacts 134 are physically and electrically coupled to the epitaxial source/drain regions 98.

As an example to form the gate contacts 132 and the source/drain contacts 134, openings for the gate contacts 132 are formed through the second ILD 124, the ESL 122, and the gate masks 116, and openings for the source/drain contacts 134 are formed through the second ILD 124, the ESL 122, the first ILD 104, and the CESL 102. The openings may be formed using acceptable photolithography and etching techniques. A liner (not separately illustrated), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 124. The remaining liner and conductive material form the gate contacts 132 and the source/drain contacts 134 in the openings. The gate contacts 132 and the source/drain contacts 134 may be formed in distinct processes, or may be formed in the same process. Although shown as being formed in the same cross-sections, it should be appreciated that each of the gate contacts 132 and the source/drain contacts 134 may be formed in different cross-sections, which may avoid shorting of the contacts.

Optionally, metal-semiconductor alloy regions 136 are formed at the interfaces between the epitaxial source/drain regions 98 and the source/drain contacts 134. The metal-semiconductor alloy regions 136 can be silicide regions formed of a metal silicide (e.g., titanium silicide, cobalt silicide, nickel silicide, etc.), germanide regions formed of a metal germanide (e.g. titanium germanide, cobalt germanide, nickel germanide, etc.), silicon-germanide regions formed of both a metal silicide and a metal germanide, or the like. The metal-semiconductor alloy regions 136 can be formed before the material(s) of the source/drain contacts 134 by depositing a metal in the openings for the source/drain contacts 134 and then performing a thermal anneal process. The metal can be any metal capable of reacting with the semiconductor materials (e.g., silicon, silicon-germanium, germanium, etc.) of the epitaxial source/drain regions 98 to form a low-resistance metal-semiconductor alloy, such as nickel, cobalt, titanium, tantalum, platinum, tungsten, other noble metals, other refractory metals, rare earth metals or their alloys. The metal can be deposited by a deposition process such as ALD, CVD, PVD, or the like. After the thermal anneal process, a cleaning process, such as a wet clean, may be performed to remove any residual metal from the openings for the source/drain contacts 134, such as from surfaces of the metal-semiconductor alloy regions 136. The material(s) of the source/drain contacts 134 can then be formed on the metal-semiconductor alloy regions 136.

Figure 19B:
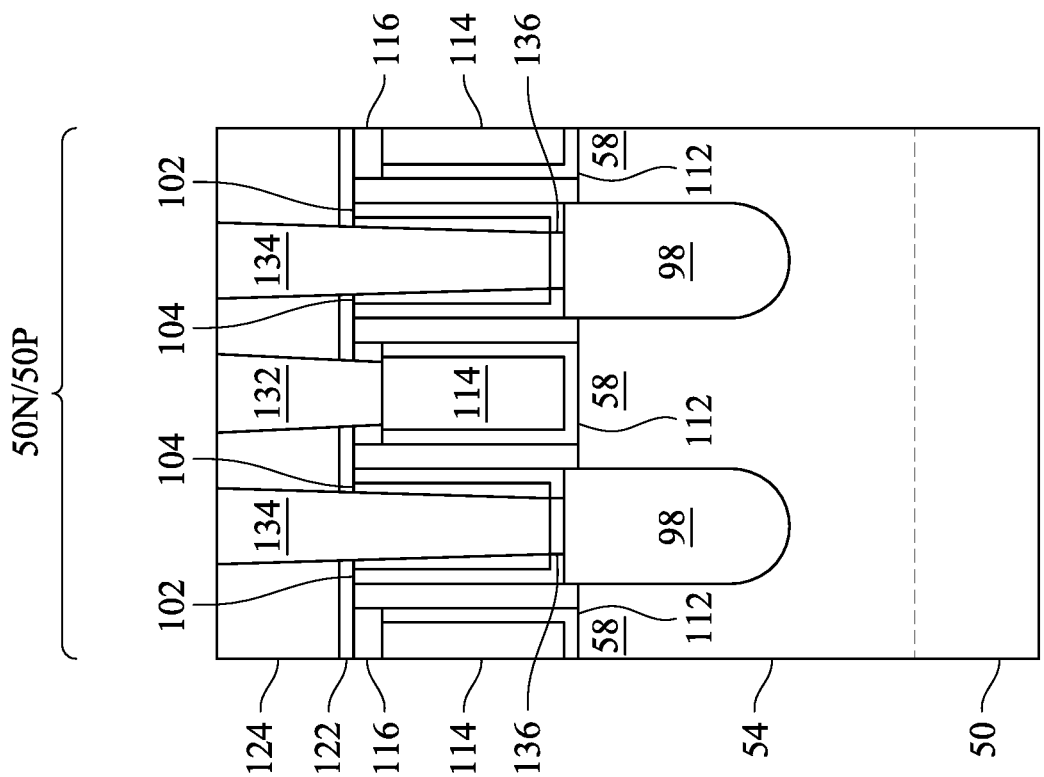
FIGS. 19A-19C are views of FinFETs, in accordance with some other embodiments.
Figure 19A:
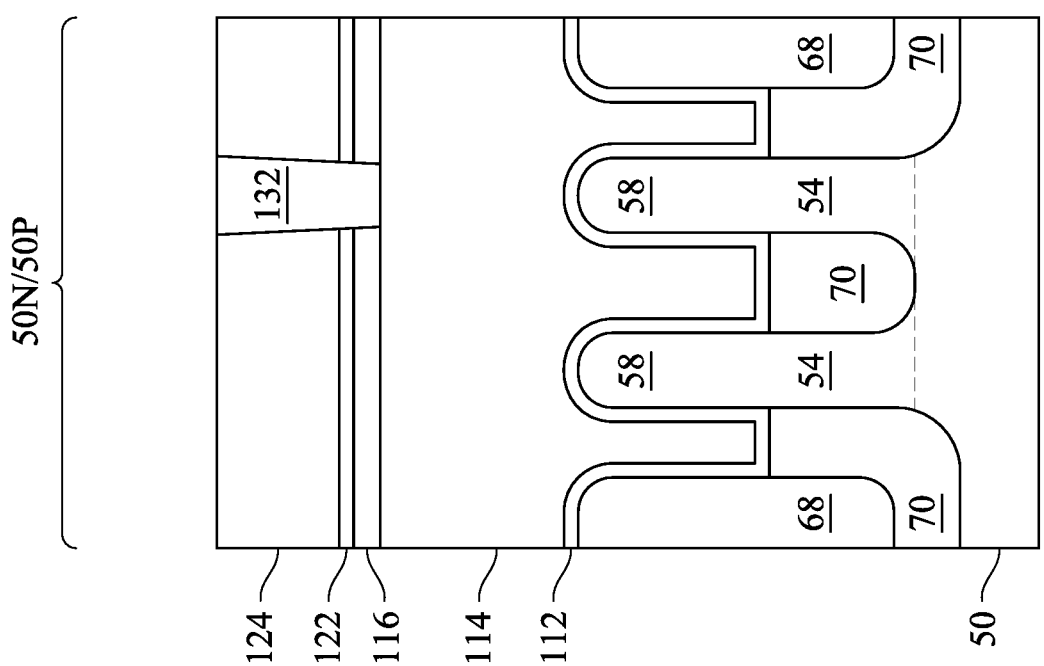
Figure 19C:
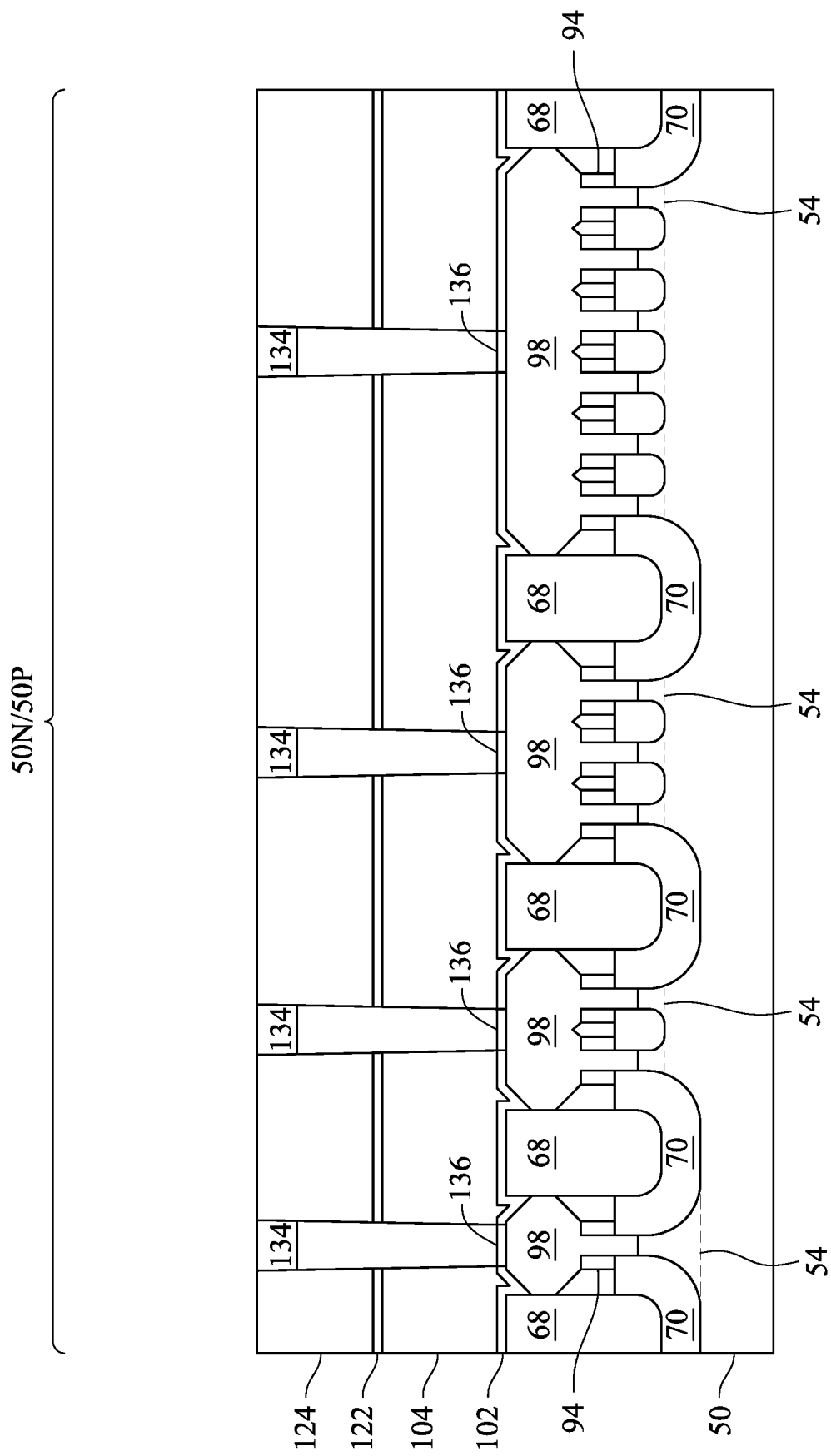

FIGS. 19A-19C are views of FinFETs, in accordance with some other embodiments. The embodiment of FIGS. 19A-19C is similar to the embodiment of FIG. 18A-18C, except the STI regions 70 have curved bottom surfaces as a result of contouring that may occur during the patterning of the semiconductor fins 54 (described for FIG. 3), and the hybrid fins 68 have curved bottom surfaces as a result of contouring that may occur during the deposition of the film stack 62 (described for FIG. 4). The curved bottom surfaces may be convex bottom surfaces. Specifically, the contouring FCVD process (described for FIG. 4) forms the film stack 62 with contoured surfaces. In some embodiments, the bottom surfaces of the hybrid fins 68 are curved and the top surfaces of the hybrid fins 68 are planar. The degree of contouring of the surfaces of the semiconductor fins 54 may be different from the degree of contouring of the surfaces of the film stack 62. As a result, the hybrid fins 68 have curved bottom surface with a first arc length, the STI regions 70 have curved bottom surfaces with a second arc length, and the second arc length is less than the first arc length. In some embodiments, the first arc length is in the range of 100 nm to 300 nm, and the second arc length is in the range of 50 nm to 70 nm.

Embodiments may achieve advantages. Depositing the fill layer 62B with a contouring FCVD process allows the flowable material of the fill layer 62B to be deposited with a high viscosity. The fill layer 62B may thus conformally fill the trenches 56B, leaving room in the trenches 56B for the hybrid fins 68 to be formed between fin structures 52.

Because the flowable material has a high viscosity, the formation of voids or seams in the insulation material 64 may be reduced, particularly in the trenches 56A. Kink defects in the devices may thus be reduced, increasing the manufacturing yield and performance of the resulting FinFETs.

The disclosed FinFET embodiments could also be applied to nanostructure devices such as nanostructure (e.g., nanosheet, nanowire, gate-all-around, or the like) field-effect transistors (NSFETs). In an NSFET embodiment, the fins are replaced by nanostructures formed by patterning a stack of alternating layers of channel layers and sacrificial layers. Dummy gate structures and source/drain regions are formed in a manner similar to the above-described embodiments. After the dummy gate structures are removed, the sacrificial layers can be partially or completely removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Patent Application Publication No. 2016/0365414, which is incorporated herein by reference in its entirety.

Further, the FinFET/NSFET devices may be interconnected by metallization layers in an overlying interconnect structure to form integrated circuits. The overlying interconnect structure can be formed in a back end of line (BEOL) process, in which the metallization layers are connected to the gate contacts 132 and the source/drain contacts 134. Additional features, such as passive devices, memories (e.g., magnetoresistive random-access memory (MRAM), resistive random access memory (RRAM), phase-change random access memory (PCRAM), etc.), or the like may be integrated with the interconnect structure during the BEOL process.

In an embodiment, a method includes: etching a trench in a substrate; depositing a liner material in the trench with an atomic layer deposition process; depositing a flowable material on the liner material and in the trench with a contouring flowable chemical vapor deposition process; converting the liner material and the flowable material to a solid insulation material, a portion of the trench remaining unfilled by the solid insulation material; and forming a hybrid fin in the portion of the trench unfilled by the solid insulation material. In some embodiments of the method, the contouring flowable chemical vapor deposition process has a first deposition rate along vertical surfaces of the trench, the contouring flowable chemical vapor deposition process has a second deposition rate along horizontal surfaces of the trench, and the first deposition rate is substantially equal to the second deposition rate. In some embodiments of the method, the flowable material is formed of silicon oxynitride, and the contouring flowable chemical vapor deposition process includes: exposing the liner material to trisilylamine, oxygen gas, and ammonia simultaneously. In some embodiments of the method, the liner material is formed of silicon nitride, and the atomic layer deposition process includes: performing an atomic layer deposition cycle by exposing the substrate to silane and ammonia cyclically; and repeating the atomic layer deposition cycle a number of times. In some embodiments of the method, exposing the liner material to trisilylamine, oxygen gas, and ammonia includes: placing the substrate in a deposition chamber; dispensing trisilylamine in the deposition chamber at a first flow rate in a range of 900 sccm to 1410 sccm; dispensing oxygen gas in the deposition chamber at a second flow rate in a range of 10 sccm to 100 sccm; and dispensing ammonia in the deposition chamber at a third flow rate in a range of 20 sccm to 100 sccm, where a ratio of the first flow rate to the third flow rate is at least 10. In some embodiments of the method, exposing the liner material to trisilylamine, oxygen gas, and ammonia further includes: generating a plasma in the deposition chamber, where the deposition chamber is maintained at a pressure of less than 600 Torr, and where the deposition chamber is maintained at a temperature in a range of 10° C. to 135° C. In some embodiments of the method, the solid insulation material is silicon oxide, and converting the liner material and the flowable material to the solid insulation material includes: annealing the liner material and the flowable material while exposing the liner material and the flowable material to steam. In some embodiments of the method, annealing the liner material and the flowable material includes annealing the liner material and the flowable material at a temperature in a range of 400° C. to 700° C. and for a duration in a range of 1 hour to 6 hours.

In an embodiment, a method includes: etching a first trench and a second trench in a substrate, the first trench having a first width, the second trench having a second width, the second width greater than the first width; depositing a flowable material in the first trench and the second trench; converting the flowable material to a solid insulation material, the solid insulation material filling the first trench, the solid insulation material lining the second trench; and recessing the solid insulation material to form a first isolation region in the first trench and to form a second isolation region in the second trench. In some embodiments, the method further includes: before recessing the solid insulation material, forming a hybrid fin on the solid insulation material in the second trench, the hybrid fin filling portions of the second trench that are unfilled by the solid insulation material. In some embodiments of the method, the portions of the second trench that are unfilled by the solid insulation material have a third width in a range of 50 nm to 100 nm. In some embodiments of the method, the flowable material is deposited to a first thickness in the second trench, the first thickness being substantially uniform along sidewalls and a bottom surface of the second trench. In some embodiments of the method, the first width is in a range of 5 nm to 12 nm, the second width is in a range of 15 nm to 40 nm, the first thickness is in a range of 10 nm to 15 nm, and a ratio of the first thickness to the second width is in a range of 20% to 100%. In some embodiments of the method, the first trench has a first depth, the second trench has a second depth, and the second depth is greater than the first depth.

In an embodiment, a device includes: a first semiconductor fin extending from a substrate; a second semiconductor fin extending from the substrate; a hybrid fin between the first semiconductor fin and the second semiconductor fin, the hybrid fin having a first curved bottom surface with a first arc length; and an isolation region having a first portion, a second portion, and a third portion, the first portion disposed between the hybrid fin and the first semiconductor fin, the second portion disposed between the hybrid fin and the second semiconductor fin, the third portion disposed between the hybrid fin and the substrate, the isolation region having a second curved bottom surface with a second arc length, the second arc length less than the first arc length. In some embodiments of the device, the first portion, the second portion, and the third portion of the isolation region have substantially uniform thicknesses. In some embodiments of the device, a top surface of the hybrid fin is level with a top surface of the first semiconductor fin and a top surface of the second semiconductor fin. In some embodiments, the device further includes: a gate dielectric on sidewalls of the hybrid fin, sidewalls of the first semiconductor fin, and sidewalls of the second semiconductor fin; and a gate electrode on the gate dielectric. In some embodiments, the device further includes: a first source/drain region in the first semiconductor fin; and a second source/drain region in the second semiconductor fin, the hybrid fin separating the first source/drain region from the second source/drain region. In some embodiments of the device, the first arc length is in a range of 100 nm to 300 nm, and the second arc length is in a range of 50 nm to 70 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
etching a trench in a substrate;
depositing a liner material in the trench with an atomic layer deposition process;
depositing a flowable material on the liner material and in the trench with a contouring flowable chemical vapor deposition process;
converting the liner material and the flowable material to a solid insulation material, a portion of the trench remaining unfilled by the solid insulation material;
forming a hybrid fin in the portion of the trench unfilled by the solid insulation materials; and
recessing the solid insulation material so that the hybrid fin protrudes above the solid insulation material.

2. The method of claim 1, wherein the contouring flowable chemical vapor deposition process has a first deposition rate along vertical surfaces of the trench, the contouring flowable chemical vapor deposition process has a second deposition rate along horizontal surfaces of the trench, and the first deposition rate is substantially equal to the second deposition rate.

3. The method of claim 1, wherein the flowable material is formed of silicon oxynitride, and the contouring flowable chemical vapor deposition process comprises:
exposing the liner material to trisilylamine, oxygen gas, and ammonia simultaneously.

4. The method of claim 3, wherein the liner material is formed of silicon nitride, and the atomic layer deposition process comprises:
performing an atomic layer deposition cycle by exposing the substrate to silane and ammonia cyclically; and
repeating the atomic layer deposition cycle a number of times.

5. The method of claim 3, wherein exposing the liner material to trisilylamine, oxygen gas, and ammonia comprises:
placing the substrate in a deposition chamber;
dispensing trisilylamine in the deposition chamber at a first flow rate in a range of 900 sccm to 1410 sccm;
dispensing oxygen gas in the deposition chamber at a second flow rate in a range of 10 sccm to 100 sccm; and
dispensing ammonia in the deposition chamber at a third flow rate in a range of 20 sccm to 100 sccm,
wherein a ratio of the first flow rate to the third flow rate is at least 10.

6. The method of claim 5, wherein exposing the liner material to trisilylamine, oxygen gas, and ammonia further comprises:
generating a plasma in the deposition chamber,
wherein the deposition chamber is maintained at a pressure of less than 600 Torr, and
wherein the deposition chamber is maintained at a temperature in a range of 10° C. to 135° C.

7. The method of claim 1, wherein the solid insulation material is silicon oxide, and wherein converting the liner material and the flowable material to the solid insulation material comprises:
annealing the liner material and the flowable material while exposing the liner material and the flowable material to steam.

8. The method of claim 7, wherein annealing the liner material and the flowable material comprises annealing the liner material and the flowable material at a temperature in a range of 400° C. to 700° C. and for a duration in a range of 1 hour to 6 hours.

9. A method comprising:
etching a first trench and a second trench in a substrate, the first trench having a first width, the second trench having a second width, the second width greater than the first width;
depositing a flowable material in the first trench and the second trench;
converting the flowable material to a solid insulation material, the solid insulation material filling the first trench, the solid insulation material lining the second trench;
forming a hybrid fin on the solid insulation material in the second trench, the hybrid fin filling portions of the second trench that are unfilled by the solid insulation material; and
recessing the solid insulation material to form a first isolation region in the first trench and to form a second isolation region in the second trench, the hybrid fin protruding above the second isolation region.

10. The method of claim 9, wherein the portions of the second trench that are unfilled by the solid insulation material have a third width in a range of 50 nm to 100 nm.

11. The method of claim 9, wherein the flowable material is deposited to a first thickness in the second trench, the first thickness being substantially uniform along sidewalls and a bottom surface of the second trench.

12. The method of claim 11, wherein the first width is in a range of 5 nm to 12 nm, the second width is in a range of 15 nm to 40 nm, the first thickness is in a range of 10 nm to 15 nm, and a ratio of the first thickness to the second width is in a range of 20% to 100%.

13. The method of claim 9, wherein the first trench has a first depth, the second trench has a second depth, and the second depth is greater than the first depth.

14. A method comprising:
etching a first trench and a second trench in a substrate, the first trench having a first width, the second trench having a second width, the second width greater than the first width;
depositing a liner material in the first trench and the second trench with an atomic layer deposition process;
depositing a flowable material on the liner material and in the first trench and the second trench with a contouring flowable chemical vapor deposition process;
converting the liner material and the flowable material to a solid insulation material, the solid insulation material filling the first trench, the solid insulation material lining the second trench, a portion of the second trench remaining unfilled by the solid insulation material;
forming a hybrid fin in the portion of the second trench unfilled by the solid insulation material; and
recessing the solid insulation material to form a first isolation region in the first trench and to form a second isolation region in the second trench, the hybrid fin protruding above the second isolation region.

15. The method of claim 14, wherein the contouring flowable chemical vapor deposition process has a first deposition rate along vertical surfaces, the contouring flowable chemical vapor deposition process has a second deposition rate along horizontal surfaces, and the first deposition rate is substantially equal to the second deposition rate.

16. The method of claim 14, wherein the flowable material is formed of silicon oxynitride, and the contouring flowable chemical vapor deposition process comprises:
exposing the liner material to trisilylamine, oxygen gas, and ammonia simultaneously.

17. The method of claim 14, wherein the solid insulation material is silicon oxide, and wherein converting the liner material and the flowable material to the solid insulation material comprises:
annealing the liner material and the flowable material while exposing the liner material and the flowable material to steam.

18. The method of claim 14, wherein the first trench has a first depth, the second trench has a second depth, and the second depth is greater than the first depth.

19. The method of claim 14, the hybrid fin having a first curved bottom surface with a first arc length, the second isolation region having a second curved bottom surface with a second arc length, the second arc length less than the first arc length.

20. The method of claim 14, further comprising:
forming a gate structure on the hybrid fin.

* * * * *

UNITED STATES PATENT AND TRADEMARK OFFICE
CERTIFICATE OF CORRECTION

PATENT NO. : 11,908,751 B2
APPLICATION NO. : 17/385561
DATED : February 20, 2024
INVENTOR(S) : Szu-Ying Chen et al.

It is certified that error appears in the above-identified patent and that said Letters Patent is hereby corrected as shown below:

In the Claims

Claim 1, Column 21, Line 44; delete "materials" and insert --material--.

Signed and Sealed this
Sixteenth Day of April, 2024

Katherine Kelly Vidal
*Director of the United States Patent and Trademark Office*